(12) United States Patent
Nakahata et al.

(10) Patent No.: US 6,337,531 B1
(45) Date of Patent: Jan. 8, 2002

(54) SURFACE-ACOUSTIC-WAVE DEVICE

(75) Inventors: Hideaki Nakahata; Masashi Narita; Akihiro Hachigo; Shin-ichi Shikata, all of Itami (JP)

(73) Assignee: Sumitomo Electric Industrial, Ltd., Osaka (JP)

( * ) Notice: Subject to any disclaimer, the term of this patent is extended or adjusted under 35 U.S.C. 154(b) by 0 days.

(21) Appl. No.: 09/504,911

(22) Filed: Feb. 16, 2000

(30) Foreign Application Priority Data

Feb. 16, 1999 (JP) ............................................. 11-037395

(51) Int. Cl.[7] ............................................... H01L 41/04
(52) U.S. Cl. ................................. 310/313 R; 310/313 A
(58) Field of Search ........................... 310/313 A, 313 R

(56) References Cited

U.S. PATENT DOCUMENTS 4,255,726 A * 3/1981 Kinoshita et al. ............ 333/195
5,838,090 A * 11/1998 Nakahata et al. ........ 310/313 A

FOREIGN PATENT DOCUMENTS

| JP | 3-198412 | 8/1991 |
|----|----------|--------|
| JP | 8-32398  | 2/1996 |
| JP | 9-219632 | 8/1997 |

* cited by examiner

*Primary Examiner*—Brian Sircus
*Assistant Examiner*—Michael C. Zarroli
(74) *Attorney, Agent, or Firm*—McDermott, Will & Emery

(57) ABSTRACT

A surface-acoustic-wave (SAW) device that has not only an increased propagation velocity of SAWs but also an increased electromechanical coupling coefficient of 20% or more. The SAW device comprises a diamond substrate 10, a $KNbO_3$ layer 30, and IDTs 40. The $KNbO_3$ layer 30 is composed of a single crystal having the layer thickness and the crystal orientation that are controlled so as to obtain a propagation velocity of 5,000 m/s or more and an electromechanical coupling coefficient of 20% or more for the SAW in a specified mode.

9 Claims, 21 Drawing Sheets

US 6,337,531 B1

SURFACE-ACOUSTIC-WAVE DEVICE

BACKGROUND OF THE INVENTION

1. Field of the Invention

The present invention relates to a surface-acoustic-wave device that utilizes surface acoustic waves propagating along the surface of a solid.

2. Description of the Background Art

Surface-acoustic-wave devices that utilize surface acoustic waves (hereinafter called SAWs) have various features such as small size, light weight, high resistance to vibration and impact, high reliability, high temperature stability, long life, and superior phase properties and hence can be widely used as frequency filters, resonators, delay devices, signal processing elements, convolvers, and functional elements for opto-electronics.

Properties of SAW devices rely largely on the property of the substrate material. The propagation velocity (v) and electromechanical coupling coefficient ($K^2$) properties of a SAW device are particularly important. A higher propagation velocity facilitates an increase in operating frequency, and an increase in electromechanical coupling coefficient can decrease losses over broad bands.

Development has been proceeding on substrate materials having a great propagation velocity and electromechanical coupling coefficient. Such substrate materials include a ZnO/diamond substrate disclosed in published Japanese patent application Tokukaihei 3-198412, a c-axis-oriented multicrystal $LiNbO_3$/diamond substrate disclosed in Tokukaihei 8-32398, and a single-crystal $LiNbO_3$/diamond substrate disclosed in Tokukaihei9-219632.

Of these, Tokukaihei 9-219632 discloses a means to determine the layer thickness and crystal orientation of a single-crystal $LiNbO_3$ layer that achieves such superior properties as v=8,000 to 11,500 m/s accompanied by $K^2$=10 to 20%.

However, it is difficult to further increase an electromechanical coupling coefficient while maintaining a propagation velocity as high as 5,000 m/s or more.

SUMMARY OF THE INVENTION

An object of the present invention is to offer a SAW device having not only an increased propagation velocity of SAWs but also an increased electromechanical coupling coefficient of 20% or more. The SAW device of the present invention is used within the frequency range of several hundred megahertz to about 20 GHz.

The present inventors found through intensive studies that the above-mentioned object can be achieved by the following means: For a SAW device in which a single crystal of $KNbO_3$, a niobate similar to $LiNbO_3$, is laminated on a diamond layer and is provided with interdigital transducers (hereinafter called IDTs), the crystal orientation and layer thickness of the single-crystal KNbO3 are controlled so as to increase both the propagation velocity and electromechanical coupling coefficient for the SAW in a mode to be utilized. Subsequently, the present inventors found a crystal orientation and layer thickness of the single-crystal $KNbO_3$ that can fulfill both v=5,000 m/s or more and $K^2$=20% or more at the same time for the SAW in a mode to be utilized.

The present invention is based on the above-mentioned finding. The IDTs may be provided either on the single-crystal $KNbO_3$ layer or between the single-crystal $KNbO_3$ layer and the diamond layer. Another structure may also be adopted in which the IDTs are provided on the single-crystal $KNbO_3$ layer and a short-circuiting electrode is provided between the single-crystal $KNbO_3$ layer and the diamond layer. Each structure has its own desirable crystal orientation and layer thickness of the single-crystal $KNbO_3$. Their desirable ranges are described in the section "description of the preferred embodiments."

DESCRIPTION OF THE PREFERRED EMBODIMENTS

The preferred embodiments of the present invention are explained in detail below with reference to the accompanying drawings. The same reference number is to the extent possible given to the same component in the individual drawings for ease of understanding, and to avoid duplicated explanations.

Figure 1:
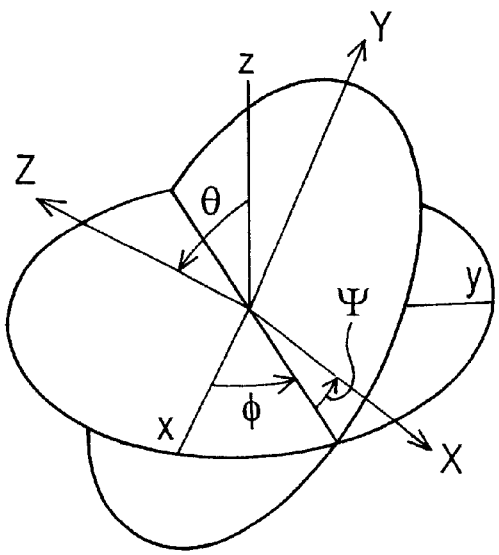
FIG. 1 is a diagram explaining an Eulerian angle representation.

In the present invention, a single-crystal $KNbO_3$ layer is used. As shown in FIG. 1, the crystal orientation of the $KNbO_3$ layer is represented by an Eulerian angle representation $(\theta, \psi, \phi)$ on an orthogonal coordinate system $(X, Y, Z)$ in which the Z-axis is set along the normal direction of the cut plane, and the X-axis is set along the SAW propagation direction (one direction on the cut plane of the $KNbO_3$ layer, which direction is determined by the configuration of the IDTs) when viewed from the crystallographic fundamental coordinate system $(x, y, z)$ of the $KNbO_3$ in the $KNbO_3$ layer.

The individual embodiments described below naturally include the crystal orientations equivalent to the crystal orientation of the $KNbO_3$ in the single-crystal $KNbO_3$ layer.

First Embodiment

Figure 2:
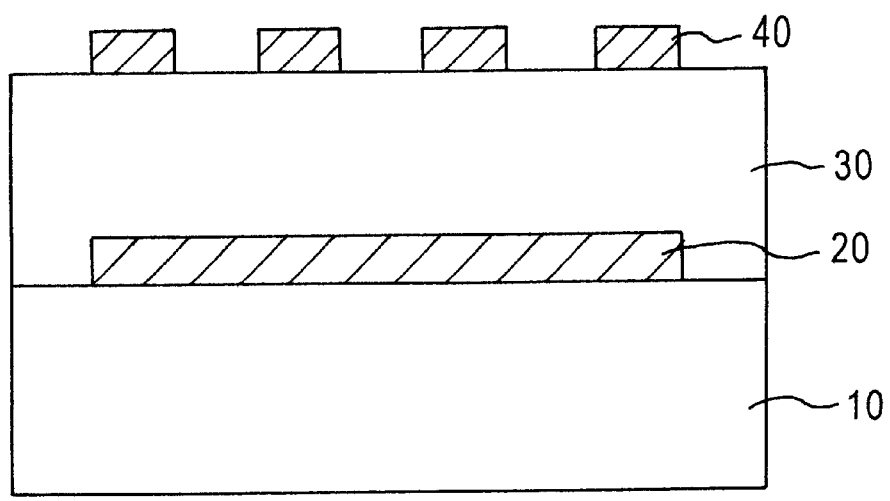
FIG. 2 is a cross-sectional view showing the structure employed in the first, forth, and seventh embodiments of the SAW device of the present invention.

FIG. 2 is a diagram showing the structure employed in the first embodiment of the SAW device of the present invention. As shown in FIG. 2, the SAW device of the first embodiment comprises a diamond substrate 10, a short-circuiting electrode 20 formed on the diamond substrate 10, a single-crystal $KNbO_3$ layer 30 laminated on the diamond substrate 10 in such a manner as to cover the short-circuiting electrode 20, and IDTs 40 formed on the single-crystal $KNbO_3$ layer 30.

Figure 3:
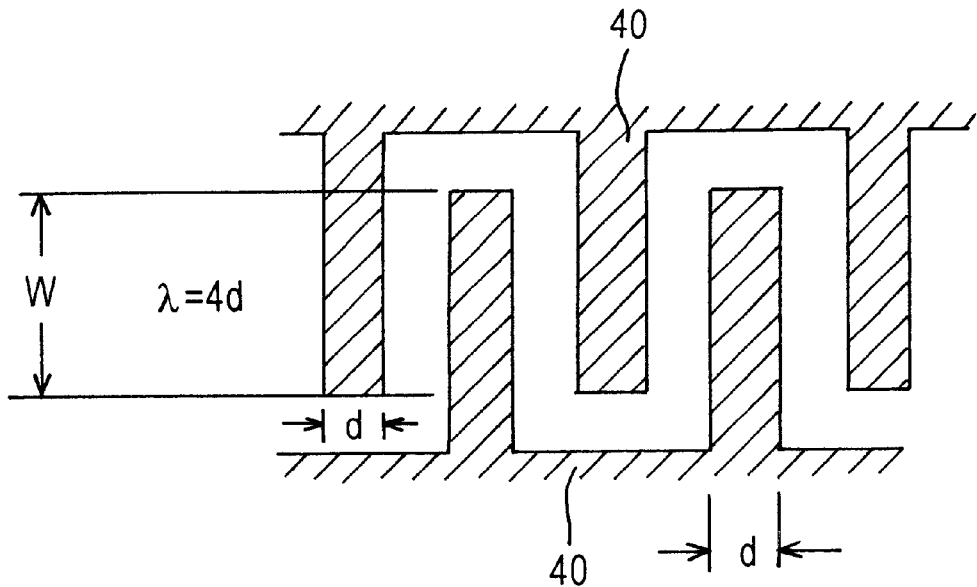
FIG. 3 is a diagram showing the first plane configuration of the IDTs.
Figure 4:
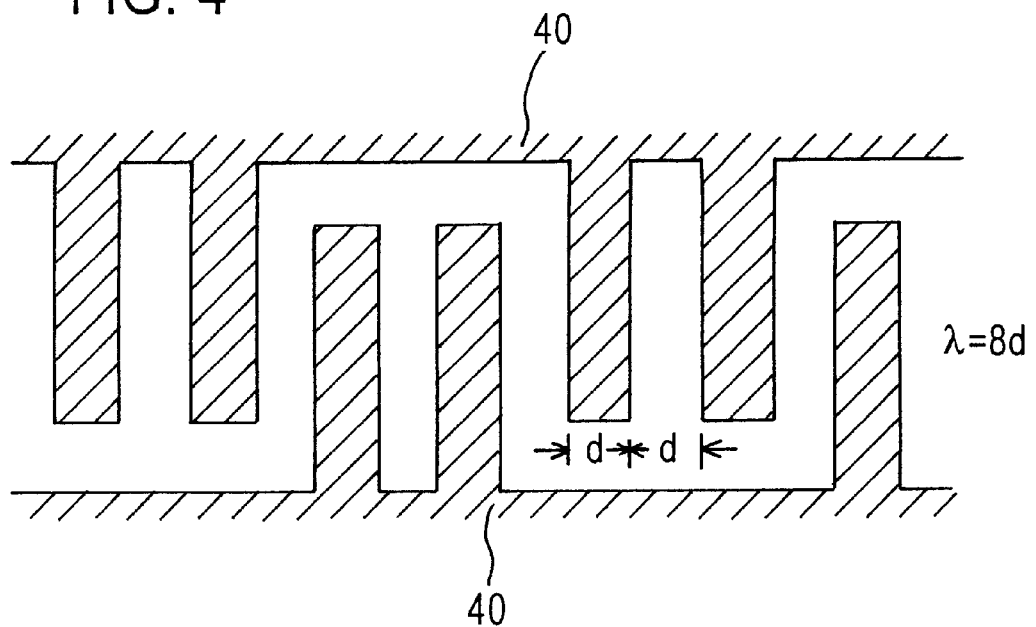
FIG. 4 is a diagram showing the second plane configuration of the IDTs.

When the IDTs 40 of a SAW device are operated to excite SAWs, a plurality of SAWs that have propagation velocity "v" different from each other are excited. In order to distinguish these SAWs, the names "the 0th-order mode," "1st-order mode," "2nd-order mode," and so on are given in ascending order of the propagation velocity. The wavelength $\lambda$ of a SAW in a SAW device is determined by the electrode width "d" of the IDTs. A single-electrode type whose plane configuration is shown in FIG. 3 has a wavelength of $\lambda = 4d$. A double-electrode type whose plane configuration is shown in FIG. 4 has a wavelength of $\lambda = 8d$. When the operating frequency is represented by "f," the SAW in a mode satisfying $v = f\lambda$ is utilized. The SAW device of the first embodiment utilizes a SAW of the 0th-order mode.

The diamond 10 may be made of single-crystal diamond, multicrystal diamond, or amorphous diamond. A diamond layer may also be grown on another material by using well-known growth methods. The diamond 10 has no special limitations in plane orientation; crystals having different plane orientations may coexist. It is desirable, however, that when the diamond 10 has a thickness of $t_2$, the value $2\pi(t_2/\lambda)$ be 4 or more, preferably 8 or more.

The short-circuiting electrode 20 equalizes the potential on the undersurface of the single-crystal $KNbO_3$ layer 30. It is desirable that this electrode be composed of a thin metal film made of Al, Au, Al—Cu alloy, or an Al—Cu laminate. It is also desirable that this electrode have a thickness of 50 to 3,000 Å or so, more desirably 100 to 500 Å. If it is excessively thin, it is difficult to establish an equipotential; if excessively thick, the propagation velocity of the SAWs is reduced.

The IDTs 40 may be made of various conductive materials. Of these materials, a thin aluminum film is preferable in terms of processability and cost. It is desirable that this film have a thickness of 100 to 5,000 Å or so, more desirably 100 to 500 Å. If it is excessively thin, the electrical resistance increases, thereby increasing the loss; if excessively thick, it causes the SAW to reflect and the targeted SAW properties cannot be obtained. The IDTs 40 may have various plane configurations other than those shown in FIGS. 3 and 4.

The first embodiment is accomplished by the following processes:

(a) The surface of the diamond 10 is polished.
(b) A thin film of the short-circuiting electrode 20 is formed on the polished surface.
(c) A lamella of single-crystal $KNbO_3$ cut so as to obtain the specified crystal orientation is laminated on the electrode 20 and diamond 10.
(d) The surface of the lamella is polished to obtain the specified thickness so that the single-crystal $KNbO_3$ layer 30 is completed.
(e) The IDTs 40 are formed on the surface of the layer 30.

Here the single-crystal $KNbO_3$ layer 30 has the thickness $t_1[\mu m]$ and crystal orientation $(\theta[°], \psi[°], \phi[°])$ that are set according to the specified conditions. The representation $kh_1 = 2\pi(t_1/\lambda)$ is used hereinafter in place of the thickness $t_1$.

The value of a desirable crystal orientation $(\theta, \psi, \phi)$ for the specified value of $kh_1$ can be represented by an arbitrary point in the realm $V_n$ of the octagonal prism having opposite octagonal planes, one of which has eight vertexes represented by $(x_{n,1}, y_{n,1}, z_n), (x_{n,2}, y_{n,2}, z_n), (x_{n,3}, y_{n,3}, z_n), (x_{n,4}, y_{n,4}, z_n), (x_{n,5}, y_{n,5}, z_n), (x_{n,6}, y_{n,6}, z_n), (x_{n,7}, y_{n,7}, z_n), (x_{n,8}, y_{n,8}, z_n)$ and the other of which has eight vertexes represented by $(x_{n+1,1}, y_{n+1,1}, z_{n+1}), (x_{n+1,2}, y_{n+1,2}, z_n), (x_{n+1,3}, y_{n+1,3}, z_{n+1}), (x_{n+1,4}, y_{n+1,4}, z_{n+1}), (x_{n+1,5}, y_{n+1,5}, z_{n+1}), (x_{n+1,6}, y_{n+1,6}, z_{n+1}), (x_{n+1,7}, y_{n+1,7}, z_{n+1}), (x_{n+1,8}, y_{n+1,8}, z_{n+1})$ when the values of $\theta$, $\psi$, and $\phi$ are represented by "x", "y", and "z," respectively, on an orthogonal coordinate system (X, Y, Z). In other words, when the vertex $P_{i,j}$ is represented by a coordinate $(x_{i,j}, y_{i,j}, z_i)$, the realm $V_i$ of the octagonal prism can be represented by 16 boundary vertexes $P_{i,j}$ and $P_{i+1,j}$, where "j" represents integers from 1 to 8.

Tables 1 to 4 show the coordinate $(x_{i,j}, y_{i,j}, z_i)$ of the vertex $P_{i,j}$ in the realm $V_i$ of the octagonal prism for $kh_1$'s values of 0.6, 0.8, 1.0, and 1.4, respectively.

TABLE 1

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_1$ |
|---|---|---|---|---|---|---|---|---|---|
| 1 | 95, 20 | 105, 15 | 105, 10 | 100, 0 | 90, 0 | 80, 0 | 85, 10 | 90, 15 | 60 |
| 2 | 95, 40 | 105, 35 | 105, 20 | 105, 0 | | 75, 0 | 80, 20 | 85, 35 | 70 |
| 3 | 90, 50 | | | | | | 80, 35 | 80, 35 | 80 |
| 4 | | | | | | | 75, 20 | 75, 35 | 90 |

TABLE 2

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_1$ |
|---|---|---|---|---|---|---|---|---|---|
| 5 | 95, 25 | 105, 15 | 105, 5 | 105, 0 | 90, 0 | 75, 0 | 80, 10 | 85, 20 | 50 |
| 6 | 95, 40 | 110, 30 | 110, 15 | 110, 0 | | 70, 0 | 70, 15 | 80, 35 | 60 |
| 7 | 100, 50 | 110, 35 | 110, 20 | | | | 70, 20 | | 70 |
| 8 | 100, 55 | 110, 40 | | | | | 75, 20 | 85, 40 | 80 |

TABLE 3

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_1$ |
|---|---|---|---|---|---|---|---|---|---|
| 9 | 95, 35 | 105, 25 | 105, 10 | 105, 0 | 90, 0 | 75, 0 | 80, 10 | 85, 15 | 40 |

TABLE 3-continued

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_1$ |
|---|---|---|---|---|---|---|---|---|---|
| 10 | 100, 30 | 110, 20 | 110, 10 | 110, 0 | | 70, 0 | 75, 15 | 85, 25 | 50 |
| 11 | 100, 40 | 110, 30 | 115, 25 | | | 65, 0 | 70, 20 | 80, 35 | 60 |
| 12 | 105, 45 | 115, 30 | 115, 20 | | | | 75, 0 | 85, 0 | 70 |
| 13 | 100, 55 | 115, 40 | | 115, 0 | 95, 0 | 70, 0 | 75, 15 | 85, 30 | 80 |
| 14 | 90, 30 | 100, 15 | 100, 10 | 105, 0 | 90, 0 | 75, 0 | 80, 10 | 80, 20 | 90 |

TABLE 4

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_1$ |
|---|---|---|---|---|---|---|---|---|---|
| 15 | 90, 15 | 100, 10 | 105, 5 | 105, 0 | 90, 0 | 75, 0 | 80, 5 | 85, 10 | 20 |
| 16 | 100, 20 | 115, 15 | 115, 10 | 115, 0 | | 70, 0 | 75, 0 | 80, 15 | 30 |
| 17 | 100, 25 | 110, 20 | | 110, 0 | | 65, 0 | 70, 10 | 80, 20 | 40 |
| 18 | 105, 35 | 120, 30 | 120, 15 | 115, 0 | | | 70, 15 | 85, 30 | 50 |
| 19 | 110, 35 | 115, 30 | | | | | | | 60 |
| 20 | 105, 30 | 110, 25 | 110, 10 | 110, 0 | | 70, 0 | 75, 10 | | 70 |

When $kh_1$ is the value $\alpha$ that is larger than 0.6 and smaller than 1.4 and is not 0.8 or 1.0, the coordinates of the individual vertexes $P_{i,j}$ and $P_{i+1,j}$ in the realm $V_i$ of the octagonal prism are obtained by a linear interpolation with the use of the coordinate values of the vertexes for the two values of $kh_1$ which has known coordinates of the vertexes, satisfies the formula $a < \alpha < b$, and is nearest to $\alpha$.

When the value $kh_1 = a$ has the coordinates of the vertexes of $(x_{m,j}, y_{m,j}, z_m)$ and the other value $kh_1 = b$ has the coordinates of the vertexes of $(x_{n,j}, y_{n,j}, z_n)$, then the coordinates of the vertexes of $(x_{i,j}(\alpha), y_{i,j}(\alpha), z_i(\alpha))$ for the value $kh_1 = \alpha$ that satisfies the formula $a < \alpha < b$ can be expressed by the following equation:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

Table 5 shows the values "m," "n," and "l" for the individual ranges of $kh_1$.

TABLE 5

| $kh_1$ | m | n | l |
|---|---|---|---|
| $0.6 < kh_1 < 0.8$ | 1 | 6 | 201 |
| | 2 | 7 | 202 |
| | 3 | 8 | 203 |
| $0.8 < kh_1 < 1.0$ | 5 | 10 | 204 |
| | 6 | 11 | 205 |
| | 7 | 12 | 206 |

TABLE 5-continued

| $kh_1$ | m | n | l |
|---|---|---|---|
|  | 8 | 13 | 207 |
| $1.0 < kh_1 < 1.4$ | 9 | 17 | 208 |
|  | 10 | 18 | 209 |
|  | 11 | 19 | 210 |
|  | 12 | 20 | 211 |

For example, when the value α is 0.07, Tables 1, 2, and 5 and equation (1) give the coordinate values of the 16 vertexes as follows:

(95, 30, 60), (107.5, 22.5, 60), (107.5, 12.5, 60), (105, 0, 60), (90, 0, 60), (75, 0, 60), (77.5, 12.5, 60), (85, 25, 60), (97.5, 45, 70), (107.5, 35, 70), (107.5, 20, 70), (107.5, 0, 70), (90, 0, 70), (72.5, 0, 70), (75, 20, 70), (82.5, 32.5, 70).

The present inventors fabricated various SAW devices with the diamond 10 having a thickness of 100 μm, with the value $kh_1$ changed from 0.2 to 3.0 in steps of 0.2, and with the crystal orientation (θ, ψ, φ) changed in steps of 10°. The SAW devices thus fabricated were subjected to the measurement of the propagation velocity "v" and the electromechanical coupling coefficient $K^2$.

Figure 5A:
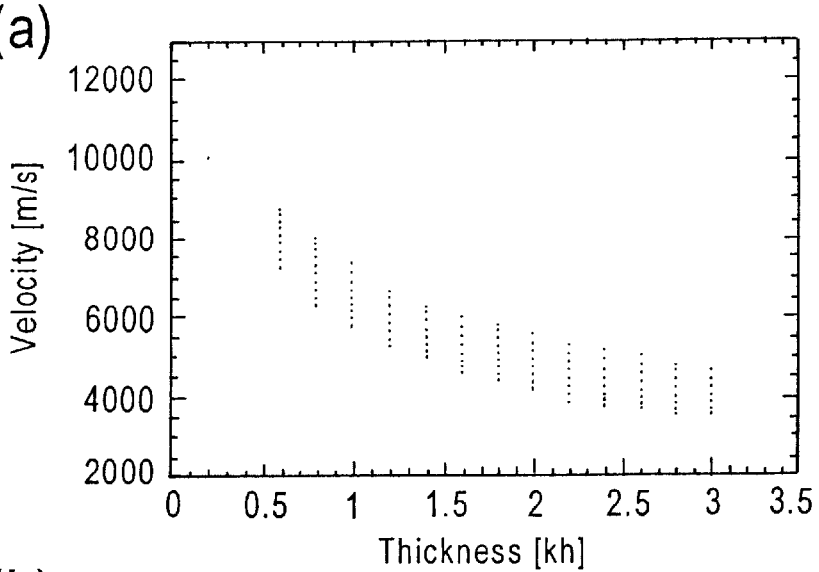
FIGS. 5(a) to 5(c) are graphs showing the relation between $kh_1$ and the propagation velocity "v" of the SAW of the 0th-order mode.
Figure 5B:
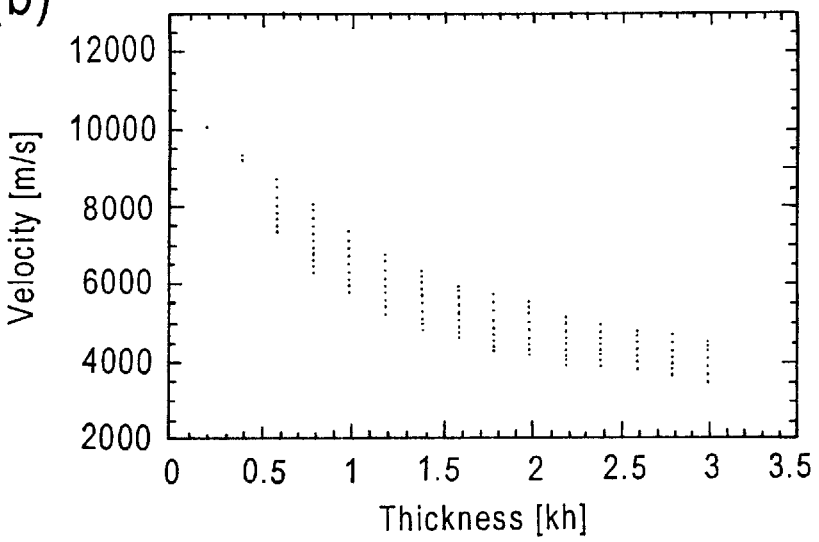
Figure 5C:
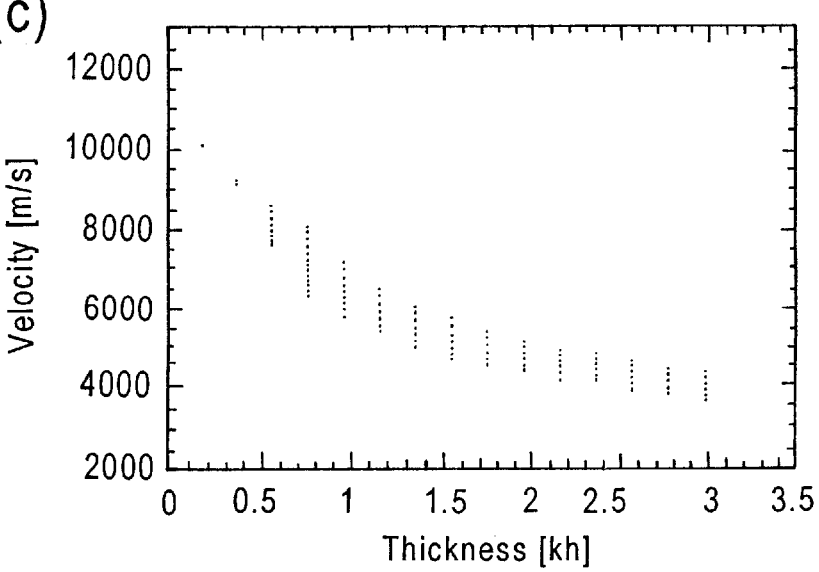
Figure 6:
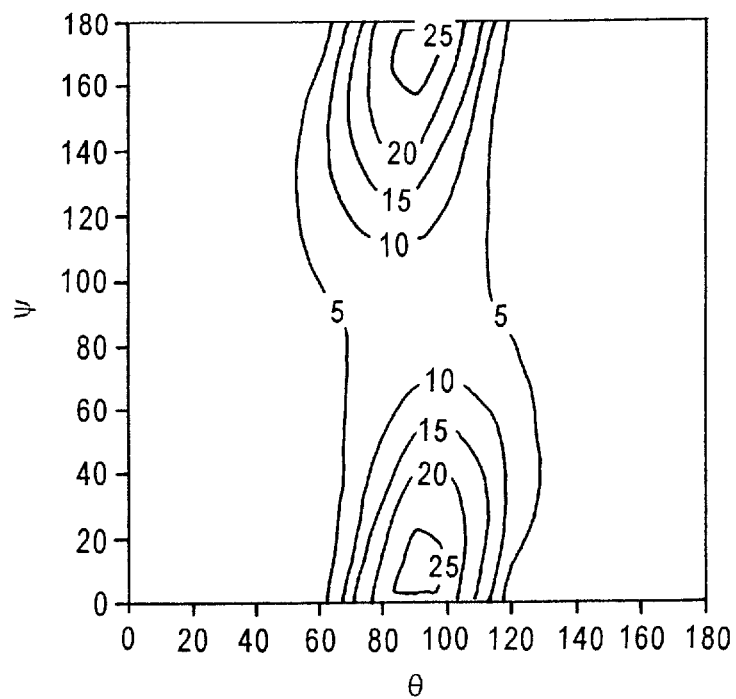
FIG. 6 is a contour-line graph showing the electromechanical coupling coefficient $K^2$ of the 0th-order mode when $kh_1$=0.6 and $\phi$=70°.
Figure 7:
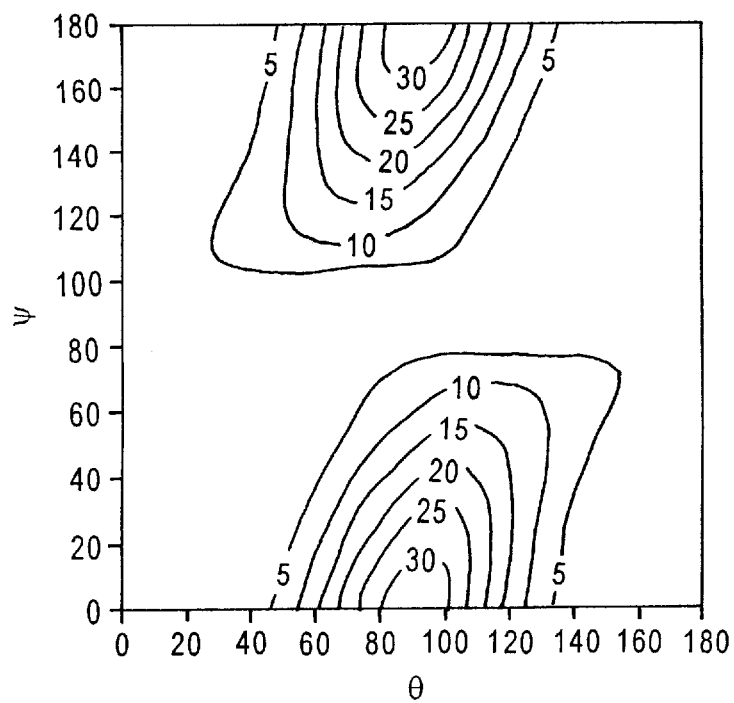
FIG. 7 is a contour-line graph showing the electromechanical coupling coefficient $K^2$ of the 0th-order mode when $kh_1$=1.0 and $\phi$=70°.

The results revealed that the propagation velocity "v" of the 0th-order mode varies with φ and $kh_1$ and that in particular, it increases with decreasing $kh_1$. FIGS. 5(a) to 5(c) are graphs showing the relation between the propagation velocity of the SAW in the 0th-order mode and $kh_1$. FIG. 5(a) shows the relation for $0° \leq \phi \leq 30°$, FIG. 5(b) for $40° \leq \phi \leq 60°$, and FIG. 5(c) for $70° \leq \phi \leq 90°$. These figures confirm that $kh_1$ is required to be 1.4 or less in order to achieve a propagation velocity as high as 5,000 m/s or more. FIG. 6 is a contour-line graph delineating equivalent positions of the electromechanical coupling coefficient $K^2$ on a system of orthogonal coordinates of θ and ψ when φ is 70° and $kh_1$ is 0.6, and in FIG. 7 when $kh_1$ is 1.0. These graphs confirm the improvement of the electromechanical coupling coefficient $K^2$ in the first embodiment.

These examinations confirmed that the SAW device of the first embodiment has an improved electromechanical coupling coefficient $K^2$ as high as 20% or more while maintaining high propagation velocity. More specifically, the SAW device has a propagation velocity "v" of 5,000 to 8,500 m/s for a SAW of the 0th-order mode and has an electromechanical coupling coefficient $K^2$ of 20 to 30%.

Second Embodiment

Figure 8:
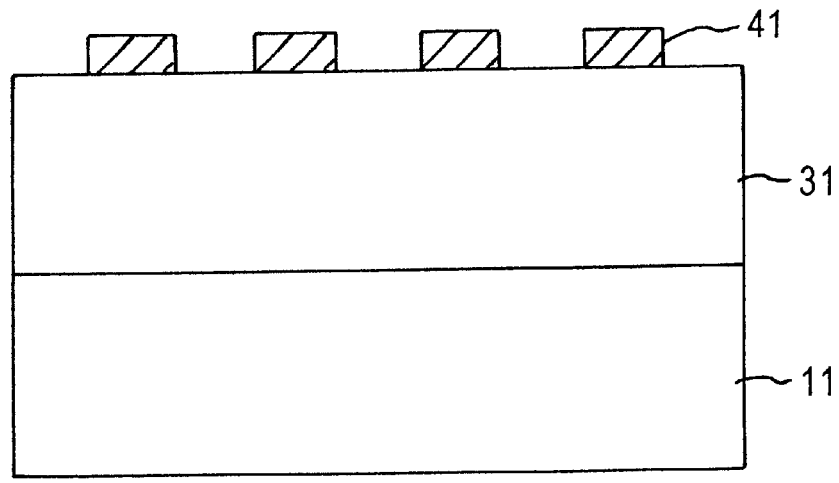
FIG. 8 is a cross-sectional view showing the structure employed in the second, fifth, and eighth embodiments of the SAW device of the present invention.

FIG. 8 is a diagram showing the structure employed in the second embodiment of the SAW device of the present invention. As shown in FIG. 8, the SAW device of the second embodiment comprises a diamond substrate 11, a single-crystal $KNbO_3$ layer 31 laminated on the diamond substrate 11, and IDTs 41 formed on the single-crystal $KNbO_3$ layer 31. As with the first embodiment, the IDTs 41 can have a plane configuration as shown in FIG. 3 or 4. As with the first embodiment, the SAW device of the second embodiment utilizes a SAW of the 0th-order mode.

The second embodiment is accomplished by the following processes:

(a) The surface of the diamond 11 is polished.

(b) A lamella of single-crystal $KNbO_3$ cut so as to obtain the specified crystal orientation is laminated on the diamond 11.

(c) The surface of the lamella is polished to obtain the specified thickness so that the single-crystal $KNOb_3$ layer 31 is completed.

(d) The IDTs 41 are formed on the surface of the layer 31.

As with the first embodiment, the thickness of the single-crystal $KNbO_3$ layer 31 is represented by the foregoing $kh_1$, and the crystal orientation of the layer 31 is represented by (θ, ψ, φ). As with the first embodiment, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8, when the values of θ, ψ, and φ are represented by "x," "y," and "z," respectively, on an orthogonal coordinate system (X, Y, Z).

Tables 6 to 8 show the coordinate ($x_{i,j}$, $y_{i,j}$, $z_i$) of the vertex $P_{i,j}$ in the realm $V_i$ of the octagonal prism for $kh_1$'s values of 0.8, 1.0, and 1.4, respectively.

TABLE 6

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 21 | 110, 20 | 125, 20 | 125, 10 | 120, 0 | 105, 0 | 60, 0 | 80, 5 | 95, 15 | 30 |
| 22 | 115, 30 | 125, 25 |  |  | 95, 0 |  | 70, 10 | 90, 25 | 40 |
| 23 | 110, 35 | 125, 30 | 125, 15 |  |  |  | 75, 20 | 90, 30 | 50 |
| 24 |  | 130, 30 | 125, 10 | 125, 0 | 90, 0 | 65, 0 | 70, 15 | 85, 35 | 60 |
| 25 | 105, 35 | 115, 30 | 115, 15 | 110, 0 |  | 70, 0 | 75, 15 | 85, 30 | 70 |
| 26 | 95, 25 | 105, 15 | 105, 10 | 105, 0 |  | 75, 0 | 80, 10 | 85, 25 | 80 |
| 27 | 90, 20 | 95, 10 | 98, 5 | 100, 0 |  | 80, 0 | 82, 5 | 85, 10 | 90 |

TABLE 7

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 28 | 90, 20 | 115, 15 | 130, 10 | 140, 0 | 90, 0 | 40, 0 | 50, 10 | 70, 20 | 0 |
| 29 | 95, 25 | 125, 25 | 135, 15 |  |  |  | 55, 10 | 75, 20 | 10 |
| 30 | 105, 30 | 130, 25 | 140, 15 | 130, 0 | 95, 0 | 45, 0 | 65, 15 | 85, 20 | 20 |
| 31 | 100, 30 | 130, 30 | 140, 20 |  | 100, 0 | 50, 0 |  | 90, 30 | 30 |
| 32 |  |  |  |  |  |  |  |  | 40 |
| 33 | 120, 40 |  | 135, 20 | 125, 0 | 95, 0 | 55, 0 | 70, 20 | 85, 30 | 50 |
| 34 | 110, 40 | 125, 35 | 125, 20 | 120, 0 | 90, 0 | 60, 0 |  | 90, 30 | 60 |
| 35 |  | 120, 30 | 120, 15 | 115, 0 |  | 65, 0 | 70, 15 | 85, 30 | 70 |

TABLE 7-continued

| i | $x_{i.1}, y_{i.1}$ | $x_{i.2}, y_{i.2}$ | $x_{i.3}, y_{i.3}$ | $x_{i.4}, y_{i.4}$ | $x_{i.5}, y_{i.5}$ | $x_{i.6}, y_{i.6}$ | $x_{i.7}, y_{i.7}$ | $x_{i.8}, y_{i.8}$ | $z_i$ |
|---|---|---|---|---|---|---|---|---|---|
| 36 | 95, 25 | 105, 20 | 105, 10 | 105, 0 |  | 75, 0 | 80, 10 | 85, 15 | 80 |
| 37 | 90, 15 | 95, 10 | 98, 5 | 100, 0 |  | 80, 0 | 82, 5 | 85, 10 | 90 |

TABLE 8

| i | $x_{i.1}, y_{i.1}$ | $x_{i.2}, y_{i.2}$ | $x_{i.3}, y_{i.3}$ | $x_{i.4}, y_{i.4}$ | $x_{i.5}, y_{i.5}$ | $x_{i.6}, y_{i.6}$ | $x_{i.7}, y_{i.7}$ | $x_{i.8}, y_{i.8}$ | $z_i$ |
|---|---|---|---|---|---|---|---|---|---|
| 38 | 90, 30 | 15, 25 | 140, 20 | 150, 0 | 90, 0 | 25, 0 | 45, 20 | 65, 25 | 0 |
| 39 | 100, 30 | 130, 30 | 150, 15 |  | 95, 0 | 30, 0 | 50, 15 | 75, 25 | 10 |
| 40 | 110, 30 | 135, 30 | 150, 20 | 140, 0 | 90, 0 | 40, 0 | 55, 10 | 80, 30 | 20 |
| 41 | 115, 35 | 140, 30 | 145, 20 | 135, 0 | 100, 0 | 45, 0 |  | 80, 25 | 30 |
| 42 | 120, 40 | 135, 35 | 140, 20 | 130, 0 |  | 50, 0 | 65, 15 | 80, 30 | 40 |
| 43 | 120, 45 | 135, 40 | 135, 20 | 125, 0 |  |  |  | 90, 30 | 50 |
| 44 | 115, 40 | 130, 35 | 130, 20 | 120, 0 | 90, 0 | 60, 0 | 70, 20 | 90, 35 | 60 |
| 45 | 110, 35 | 120, 30 | 115, 10 | 110, 0 |  | 70, 0 | 75, 15 | 90, 30 | 70 |
| 46 | 100, 15 | 110, 10 | 110, 10 |  |  | 80, 0 | 85, 5 | 90, 10 | 80 |

When $kh_1$ is the value $\alpha$ that is larger than 0.8 and smaller than 1.4 and is not 1.0, the coordinates of the individual vertexes $P_{i,j}$ and $P_{i+1,j}$ in the realm $V_i$ of the octagonal prism are obtained, as in the first embodiment, by a linear interpolation as expressed in equation (1) with the use of the coordinate values of the vertexes for the two values of $kh_1$ which has known coordinates of the vertexes, satisfies the formula $a<\alpha<b$, and is nearer to $\alpha$. Table 9 shows the values "m," "n," and "l" for the individual ranges of $kh_1$.

TABLE 9

| $kh_1$ | m | n | l |
|---|---|---|---|
| $0.8 < kh_1 < 1.0$ | 21 | 31 | 212 |
|  | 22 | 32 | 213 |
|  | 23 | 33 | 214 |
|  | 24 | 34 | 215 |
|  | 25 | 35 | 216 |
|  | 26 | 36 | 217 |
|  | 27 | 37 | 218 |
| $1.0 < kh_1 < 1.4$ | 28 | 38 | 219 |
|  | 29 | 39 | 220 |
|  | 30 | 40 | 221 |
|  | 31 | 41 | 222 |
|  | 32 | 42 | 223 |
|  | 33 | 43 | 224 |
|  | 34 | 44 | 225 |
|  | 35 | 45 | 226 |
|  | 36 | 46 | 227 |

As with the first embodiment, various SAW devices were fabricated to evaluate the propagation velocity "v" and the electromechanical coupling coefficient $K^2$. The measured results of the propagation velocity "v" can be explained by the same description as in the first embodiment without alteration, and hence the explanation is omitted.

Figure 9:
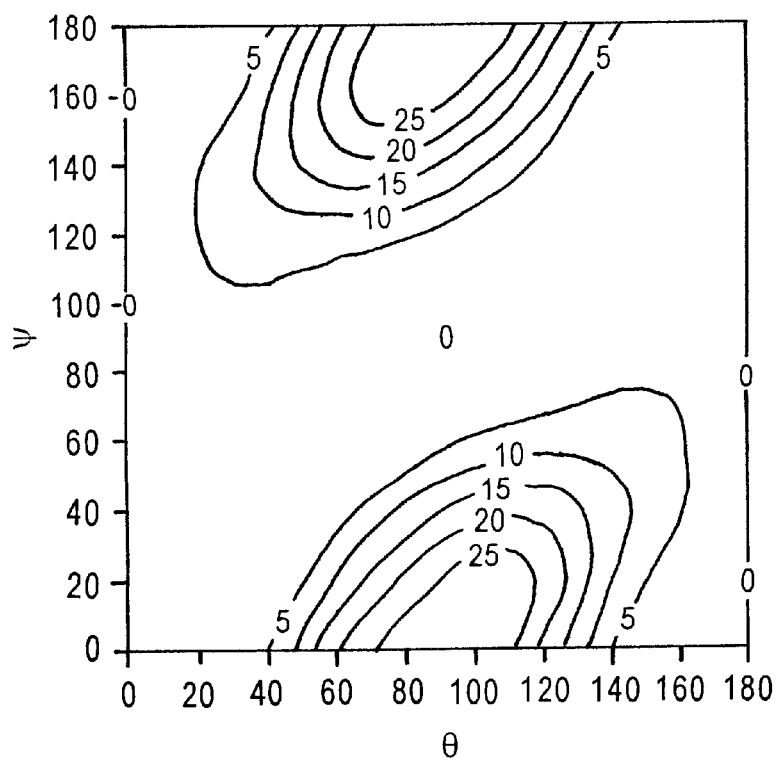
FIG. 9 is a contour-line graph showing the electromechanical coupling coefficient $K^2$ of the 0th-order mode when $kh_1$=0.8 and $\phi$=50°.
Figure 10:
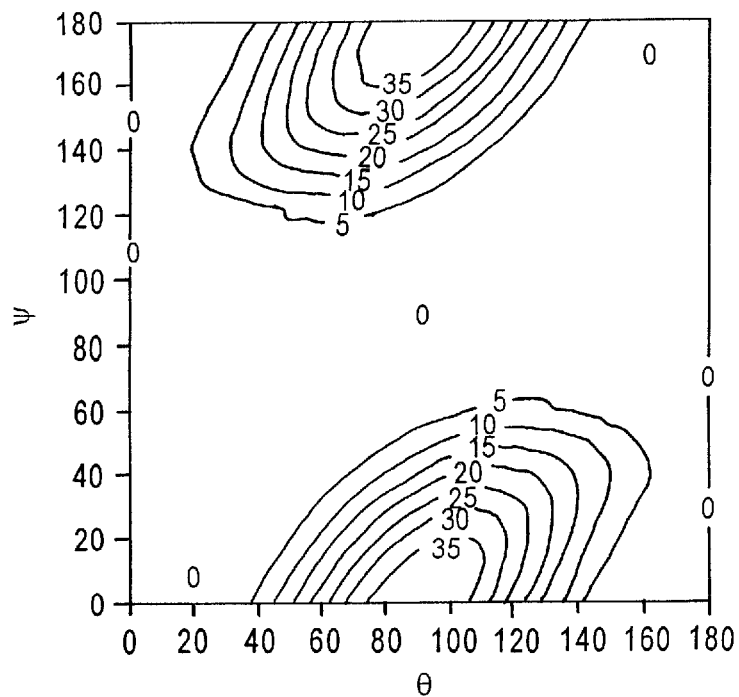
FIG. 10 is a contour-line graph showing the electromechanical coupling coefficient $K^2$ of the 0th-order mode when $kh_1$=1.0 and $\phi$=50°.
Figure 11:
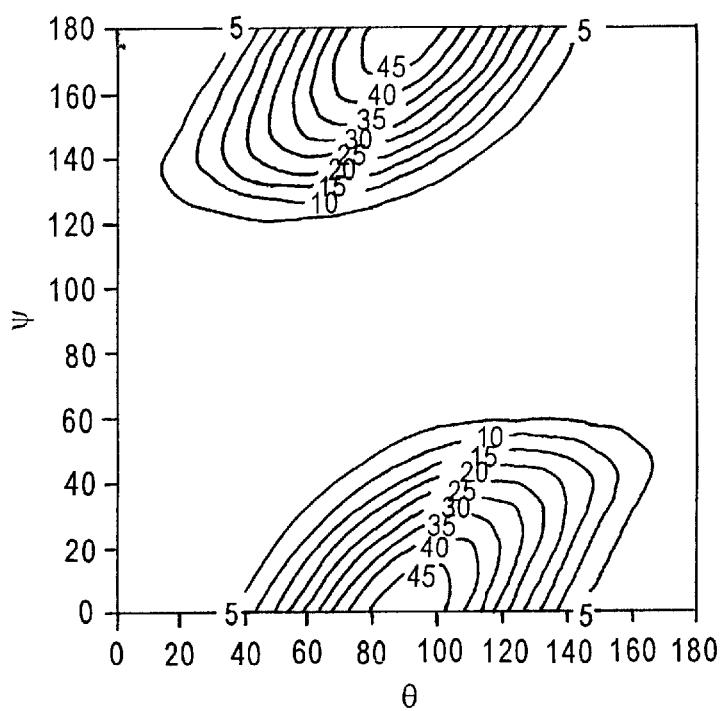
FIG. 11 is a contour-line graph showing the electromechanical coupling coefficient $K^2$ of the 0th-order mode when $kh_1$=1.4 and $\phi$=50°.

FIG. 9 is a contour-line graph delineating equivalent positions of the electromechanical coupling coefficient $K^2$ on a system of orthogonal coordinates of θ and ψ when φ is 50° and $kh_1$ is 0.8, FIG. 10 when $kh_1$ is 1.0, and FIG. 11 when $kh_1$ is 1.4. These graphs confirm the improvement of the electromechanical coupling coefficient $K^2$ in the second embodiment These examinations confirmed that the SAW device of the second embodiment has an improved electromechanical coupling coefficient $K^2$ as high as 20% or more while maintaining high propagation velocity. More specifically, the SAW device has a propagation velocity "v" of 5,000 to 8,000 m/s for a SAW in the 0th-order mode and an electromechanical coupling coefficient $K^2$ of 20 to 45%.

Third Embodiment

Figure 12:
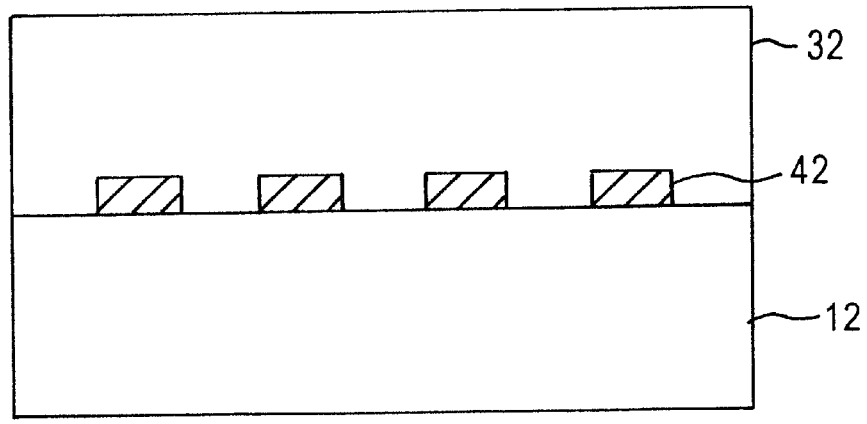
FIG. 12 is a cross-sectional view showing the structure employed in the third, sixth, and ninth embodiments of the SAW device of the present invention.

FIG. 12 is a diagram showing the structure employed in the third embodiment of the SAW device of the present invention. As shown in FIG. 12, the SAW device of the third embodiment comprises a diamond substrate 12, IDTs 42 formed on the diamond substrate 12, and a single-crystal $KNbO_3$ layer 32 laminated on the diamond substrate 12 in such a manner as to cover the IDTs 42. As with the first and second embodiments, the IDTs 42 can have a plane configuration as shown in FIG. 3 or 4. As with the first and second embodiments, the SAW device of the third embodiment utilizes a SAW of the 0th-order mode.

The third embodiment is accomplished by the following processes:

(a) The surface of the diamond 12 is polished.
(b) The IDTs 42 are formed on the surface of the diamond 12.
(c) A lamella of single-crystal $KNbO_3$ cut so as to obtain the specified crystal orientation is laminated on the IDTs 42 and the diamond 12.
(d) The surface of the lamella is polished to obtain the specified thickness so that the single-crystal $KNbO_3$ layer 32 is completed.

As with the first and second embodiments, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Tables 10 and 11 show the coordinate $(x_{i,j}, y_{i,j}, z_i)$ of the vertex $P_{i,j}$ in the m $V_i$ of the octagonal prism for $kh_1$'s values of 1.0 and 1.4, respectively.

TABLE 10

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 47 | 90, 5 | 105, 5 | 120, 5 | 130, 0 | 90, 0 | 50, 0 | 60, 5 | 75, 5 | 0 |
| 48 | 105, 10 | 125, 10 | 125, 5 | 120, 0 | | 60, 0 | 75, 5 | 90, 5 | 10 |
| 49 | 110, 15 | 125, 15 | 125, 10 | 115, 0 | 95, 0 | 65, 0 | 80, 10 | 90, 10 | 20 |
| 50 | 110, 20 | | 120, 10 | 110, 0 | | | 85, 10 | 95, 15 | 30 |
| 51 | 115, 25 | 125, 20 | | | | 70, 0 | | 95, 20 | 40 |
| 52 | 110, 30 | 120, 25 | 110, 10 | 105, 0 | 90, 0 | | | 100, 30 | 50 |
| 53 | 100, 25 | 105, 20 | 102, 10 | 100, 5 | 95, 5 | 85, 5 | 90, 10 | 95, 15 | 60 |

TABLE 11

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 54 | 90, 15 | 110, 15 | 130, 10 | 145, 0 | 90, 0 | 30, 0 | 45, 10 | 70, 15 | 0 |
| 55 | 100, 20 | 125, 20 | 140, 15 | 140, 0 | 100, 0 | 40, 0 | 60, 10 | 80, 15 | 10 |
| 56 | 110, 25 | 130, 25 | | 130, 0 | | 50, 0 | 65, 10 | 85, 20 | 20 |
| 57 | 120, 25 | 135, 25 | 135, 10 | 125, 0 | 90, 0 | 60, 0 | 75, 10 | 95, 20 | 30 |
| 58 | 120, 30 | | 130, 10 | 115, 0 | 95, 0 | 65, 0 | 85, 25 | 100, 30 | 40 |
| 59 | | 125, 20 | 115, 10 | 110, 0 | | 70, 0 | 85, 15 | 100, 20 | 50 |

When $kh_1$ is the value α that is larger than 1.0 and smaller than 1.4, the coordinates of the individual vertexes $P_{i,j}$ and $P_{i+1,j}$ in the realm $V_i$ of the octagonal prism are obtained, as in the first and second embodiments, by a linear interpolation as expressed in equation (1) with the use of the coordinate values of the vertexes for the two values of $kh_1$ which has known coordinates of the vertexes and satisfies the formula a <α<b. Table 12 shows the values "m," "n," and "l" for the range of $kh_1$.

TABLE 12

| $kh_1$ | m | n | l |
|---|---|---|---|
| $1.0 < kh_1 < 1.4$ | 47 | 54 | 228 |
| | 48 | 55 | 229 |
| | 49 | 56 | 230 |
| | 50 | 57 | 231 |
| | 51 | 58 | 232 |
| | 52 | 59 | 233 |

As with the first and second embodiments, various SAW devices were fabricated to evaluate the propagation velocity "v" and the electromechanical coupling coefficient $K^2$. The measured results of the propagation velocity "v" can be explained by the same description as in the first embodiment without alteration, and hence the explanation is omitted.

Figure 13:
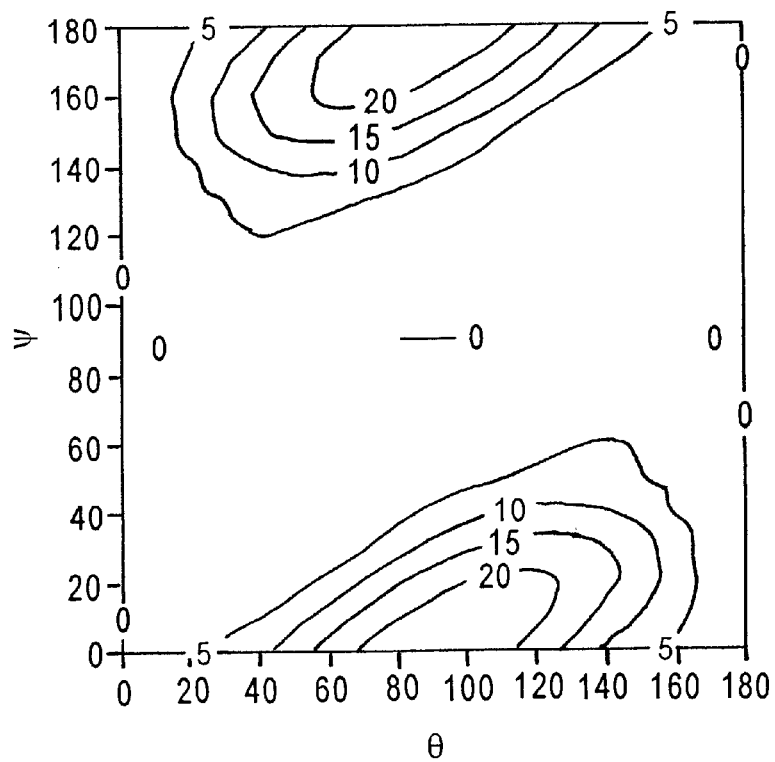
FIG. 13 is a contour-line graph showing the electromechanical coupling coefficient $K^2$ of the 0th-order mode when $kh_1$=1.0 and $\phi$=30°.
Figure 14:
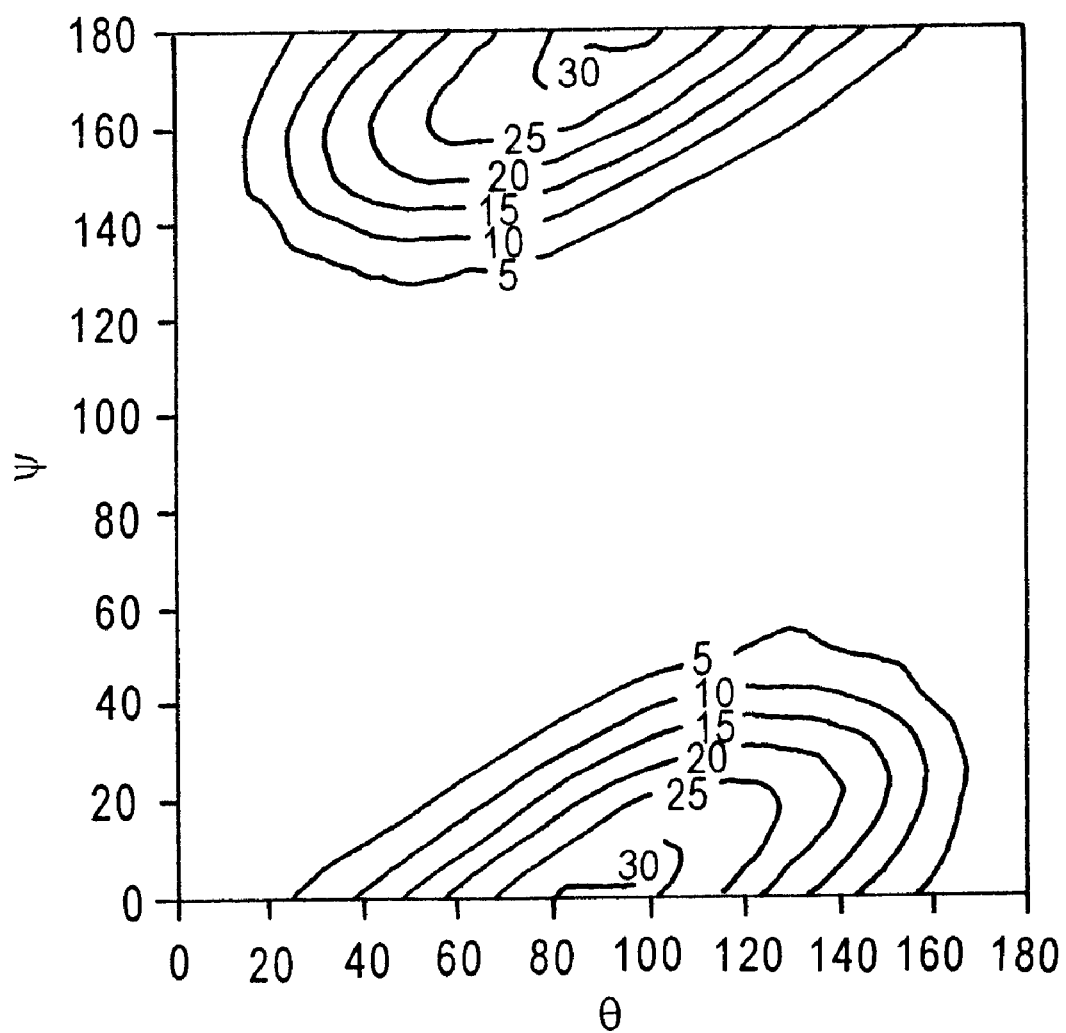
FIG. 14 is a contour-line graph showing the electromechanical coupling coefficient $K^2$ of the 0th-order mode when $kh_1$=1.4 and $\phi$=30°.

FIG. 13 is a contour-line graph delineating equivalent positions of the electromechanical coupling coefficient $K^2$ on a system of orthogonal coordinates of θ and ψ when φ is 30° and $kh_1$ is 1.0, and in FIG. 14 when $kh_1$ is 1.4. These graphs confirm the improvement of the electromechanical coupling coefficient $K^2$ in the third embodiment.

These examinations confirmed that the SAW device of the third embodiment has an improved electromechanical coupling coefficient $K^2$ as high as 20% or more while maintaining high propagation velocity. More specifically, the SAW device has a propagation velocity "v" of 5,000 to 7,000 m/s for a SAW of the 0th-order mode and has an electromechanical coupling coefficient $K^2$ of 20 to 30%.

Fourth Embodiment

The fourth embodiment has the same structure as the first embodiment as shown in FIG. 2. As distinct from the first embodiment, the fourth embodiment utilizes a SAW of the 1st-order mode.

As with the first to third embodiments, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Table 13 shows the coordinate $(x_{i,j}, y_{i,j}, z_i)$ of the vertex $P_{i,j}$ in the realm $V_i$ of the octagonal prism when $kh_1$ is 0.4.

TABLE 13

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 60 | 90, 18 | 93, 15 | 95, 10 | 97, 5 | 90, 5 | 83, 5 | 85, 10 | 87, 15 | 70 |
| 61 | 90, 30 | 100, 25 | 100, 10 | 100, 0 | 90, 0 | 75, 0 | 75, 10 | 80, 25 | 80 |
| 62 | 90, 40 | 100, 30 | 100, 15 | 105, 0 | | | 75, 15 | | 90 |

As with the first to third embodiments, various SAW devices were fabricated to evaluate the propagation velocity "v" and the electromechanical coupling coefficient $K^2$.

Figure 15A:
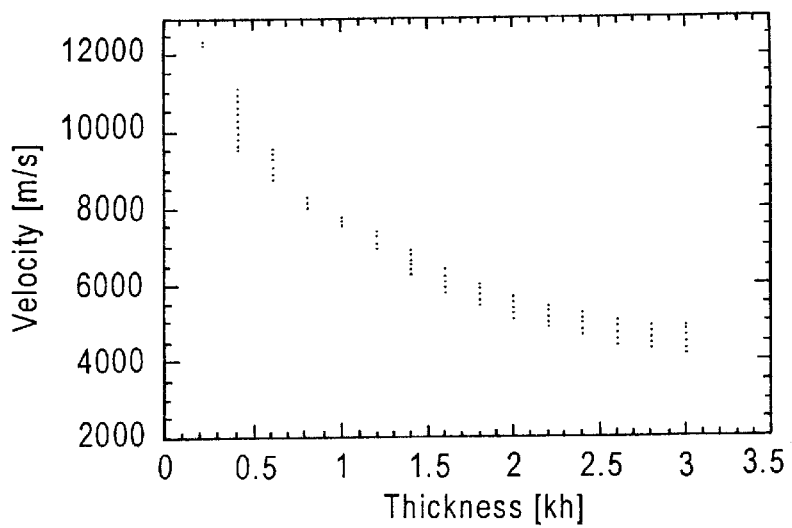
FIGS. 15(a) to 15(c) are graphs showing the relation between $kh_1$ and the propagation velocity "v" of the SAW in the 1st-order mode.
Figure 15B:
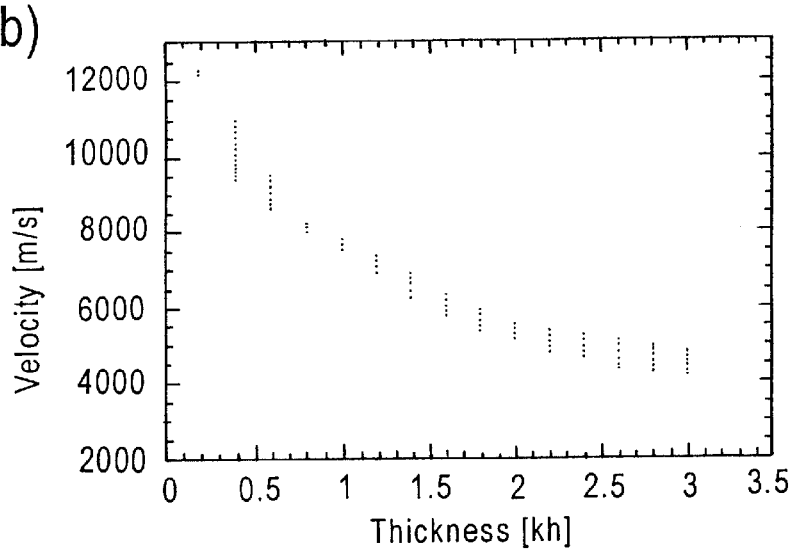
Figure 15C:
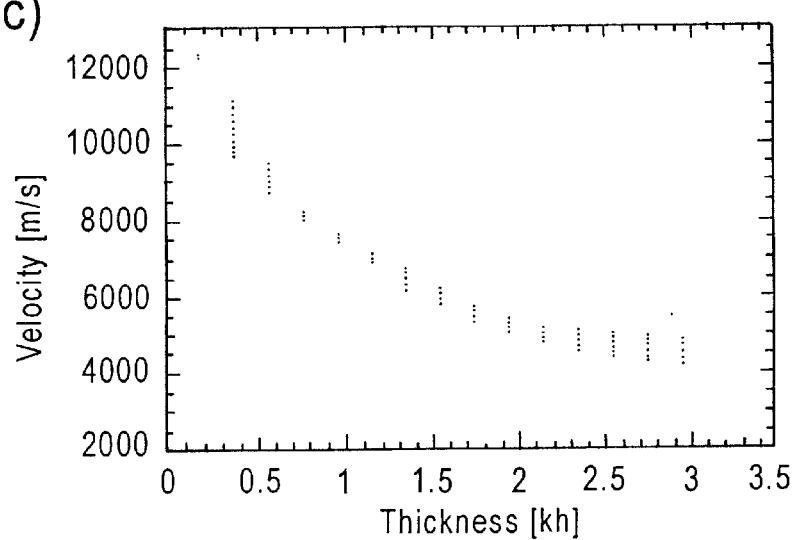

The results revealed d that the propagation velocity "v" in the 1st-order mode also varies with φ and $kh_1$ and that in particular, it increases with decreasing $kh_1$. FIGS. 15(a) to 15(c) are graphs showing the relation between the propagation velocity of the SAW in the 1st-order mode and $kh_1$. FIG. 15(a) shows the relation for 0°≤φ≤30°, FIG. 15(b) for 40°≤φ≤60°, and FIG. 15(c) for 70°≤φ≤90°. These figures confirm that $kh_1$ is required to be 2.0 or less in order to achieve a propagation velocity as high as 5,000 m/s or more.

Figure 16:
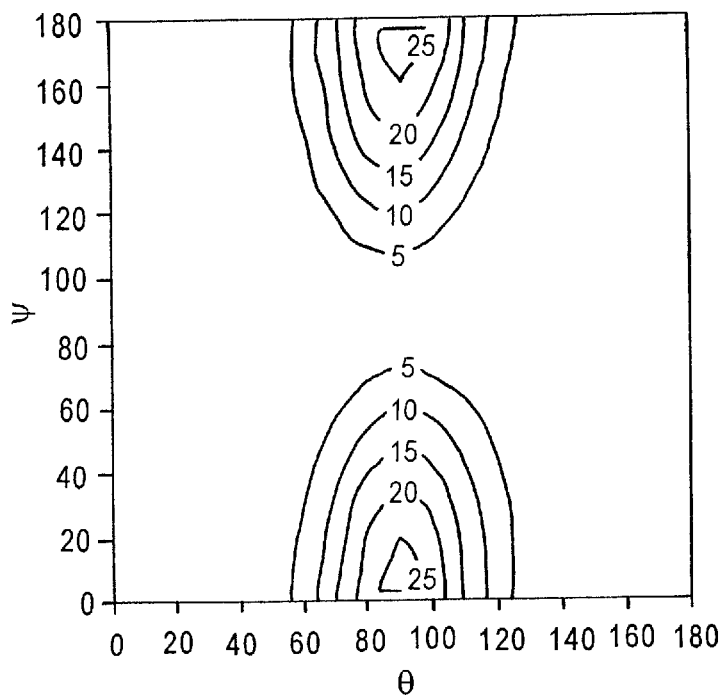
FIG. 16 is a contour-line graph showing the electromechanical coupling coefficient $K^2$ of the 1st-order mode when $kh_1$=0.4 and $\phi$=80°.

FIG. 16 is a contour-line graph delineating equivalent positions of the electromechanical coupling coefficient $K^2$ on a system of orthogonal coordinates of θ and ψ when φ is 80° and $kh_1$ is 0.4. This graph confirms the improvement of the electromechanical coupling coefficient $K^2$ in the fourth embodiment.

These examinations confirmed that the SAW device of the fourth embodiment has an improved electromechanical coupling coefficient $K^2$ as high as 20% or more while maintaining high propagation velocity. More specifically, the SAW device has a propagation velocity "v" of 9,500 to 11,000 m/s for a SAW of the 1st-order mode and has an electromechanical coupling coefficient $K^2$ of 20 to 25%.

Fifth Embodiment

The fifth embodiment has the same structure as the second embodiment as shown in FIG. 8. As distinct from the second embodiment, the fifth embodiment utilizes a SAW of the 1st-order mode.

As with the first to fourth embodiments, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Tables 14 and 15 show the coordinate $(x_{i,j}, y_{i,j}, z_i)$ of the vertex $P_{i,j}$ in the m $V_i$ of the octagonal prism when $kh_1$ is 1.0 and 1.2, respectively.

As with the first to fourth embodiments, various SAW devices were fabricated to evaluate the propagation velocity "v" and the electromechanical coupling coefficient $K^2$. The measured results of the propagation velocity "v" can be explained by the same description as in the fourth embodiment without alteration, and hence the explanation is omitted.

Figure 17:
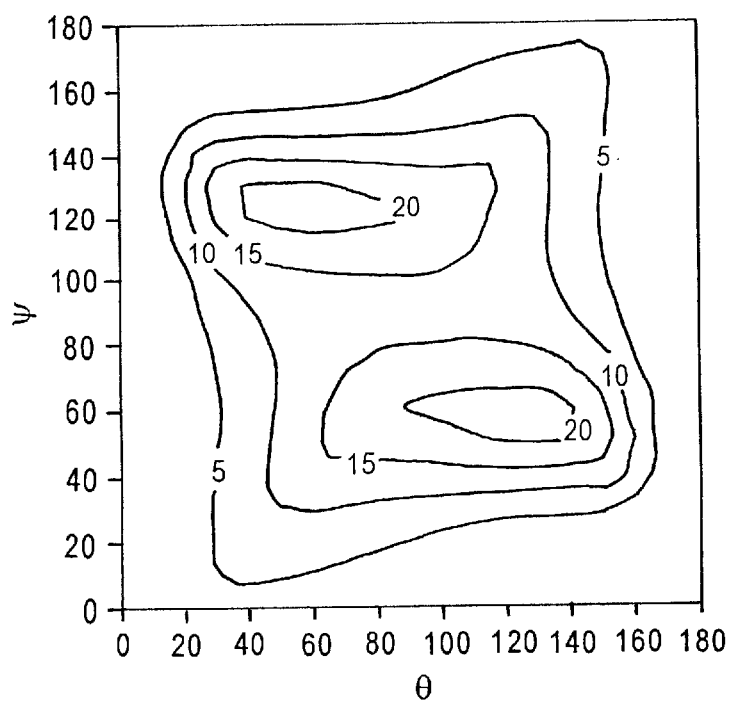
FIG. 17 is a contour-line graph showing the electromechanical coupling coefficient $K^2$ of the 1st-order mode when $kh_1$=1.0 and $\phi$=30°.
Figure 18:
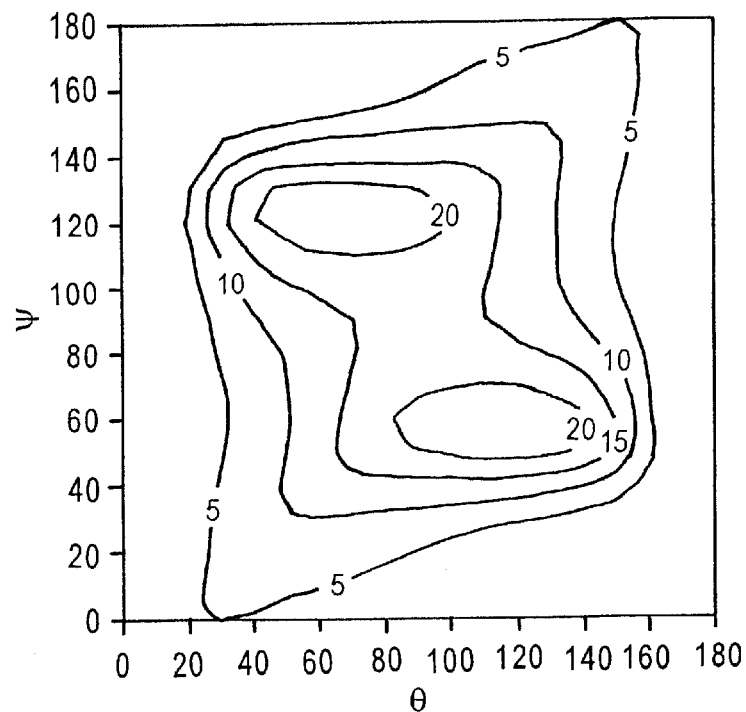
FIG. 18 is a contour-line graph showing the electromechanical coupling coefficient $K^2$ of the 1st-order mode when $kh_1$=1.2 and $\phi$=30°.

FIG. 17 is a contour-line graph delineating equivalent positions of the electromechanical coupling coefficient $K^2$ on a system of orthogonal coordinates of θ and ψ when φ is 30° and $kh_1$ is 1.0, and in FIG. 18 when $kh_1$ is 1.2. These graphs confirm the improvement of the electromechanical coupling coefficient $K^2$ in the fifth embodiment.

These examinations confirmed that the SAW device of the fifth embodiment has an improved electromechanical coupling coefficient $K^2$ as high as 20% while maintaining high propagation velocity. More specifically, the SAW device has a propagation velocity "v" of 7,000 to 7,500 m/s for a SAW

TABLE 14

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 63 | 120, 55 | 125, 50 | 125, 50 | 120, 50 | 115, 50 | 110, 50 | 110, 55 | 115, 55 | 10 |
| 64 | 120, 60 | 130, 55 | 135, 50 | 130, 50 | 120, 50 | | | 115, 60 | 20 |
| 65 | 125, 65 | 140, 60 | 145, 50 | | | 105, 55 | 60, 60 | 105, 65 | 30 |
| 66 | 120, 70 | 135, 70 | 145, 60 | 135, 55 | 125, 55 | 110, 55 | 100, 60 | | 40 |
| 67 | 125, 75 | 140, 70 | 150, 60 | 140, 55 | | 115, 55 | | 110, 70 | 50 |
| 68 | 130, 75 | | 150, 70 | 140, 65 | 130, 60 | 120, 60 | 105, 70 | 115, 75 | 60 |

TABLE 15

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 69 | 90, 65 | 110, 60 | 120, 50 | 110, 45 | 95, 45 | 80, 45 | 60, 45 | 70, 60 | 0 |
| 70 | 110, 60 | 115, 65 | 130, 50 | 115, 45 | 100, 45 | | 70, 50 | 80, 65 | 10 |
| 71 | 105, 70 | 120, 65 | 135, 55 | 125, 50 | 110, 50 | 95, 50 | 80, 50 | 85, 60 | 20 |
| 72 | 120, 75 | 130, 65 | 140, 50 | 130, 45 | 120, 45 | 100, 45 | 85, 55 | 100, 70 | 30 |
| 73 | | 135, 70 | 145, 60 | 140, 53 | 125, 50 | 115, 50 | 100, 55 | | 40 |
| 74 | 125, 75 | | 145, 65 | 135, 55 | 125, 55 | 110, 55 | 105, 65 | 110, 75 | 50 |
| 75 | 130, 80 | 140, 75 | 145, 70 | 140, 70 | 130, 65 | 120, 65 | 110, 70 | 120, 80 | 60 |

When $kh_1$ is the value α of that is larger than 1.0 and smaller than 1.2, the coordinates of the individual vertexes $P_{i,j}$ and $P_{i+1,j}$ in the realm $V_i$ of the octagonal prism are obtained, as in the first to fourth embodiments, by a linear interpolation as expressed in equation (1) with the use of the coordinate values vertexes for the two values of $kh_1$ which has known coordinates of the vertexes and satisfies the formula a<α<b. Table 16 shows the values "m" "n," and "l" for the range of $kh_1$.

TABLE 16

| $kh_1$ | m | n | l |
|---|---|---|---|
| 1.0 < $kh_1$ < 1.2 | 63 | 70 | 234 |
| | 64 | 71 | 235 |
| | 65 | 72 | 236 |

TABLE 16-continued

| $kh_1$ | m | n | l |
|---|---|---|---|
| | 66 | 73 | 237 |
| | 67 | 74 | 238 |
| | 68 | 75 | 239 |

Sixth Embodiment

The sixth embodiment has the same structure as the third embodiment as shown in FIG. 12. Distinct from the third embodiment, the sixth embodiment utilizes a SAW of the 1st-order mode.

As with the first to fifth embodiments, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Table 17 shows the coordinate $(x_{i,j}, y_{i,j}, z_i)$ of the vertex $P_{i,j}$ in the realm $V_i$ of the octagonal prism when $kh_1$ is 1.2.

TABLE 17

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 76 | 95, 55 | 105, 55 | 110, 50 | 105, 45 | 95, 45 | 80, 45 | 70, 50 | 80, 55 | 0 |
| 77 | 100, 55 | 110, 55 | 120, 50 | 110, 45 | 100, 45 | 90, 45 | 80, 50 | 90, 55 | 10 |
| 78 | 110, 55 | 115, 55 | | 115, 45 | 110, 45 | 100, 45 | 85, 50 | 95, 55 | 20 |
| 79 | 115, 60 | 125, 60 | 125, 55 | 120, 50 | 115, 50 | 105, 50 | 100, 60 | 105, 60 | 30 |
| 80 | 125, 65 | 130, 65 | 135, 60 | 130, 55 | 125, 55 | 115, 55 | 110, 60 | 115, 65 | 40 |

As with the first to fifth embodiments, various SAW devices were fabricated to evaluate the propagation velocity "v" and the electromechanical coupling coefficient $K^2$. The measured results of the propagation velocity "v" can be explained by the same description as in the fourth embodiment without alteration, and hence the explanation is omitted.

Figure 19:
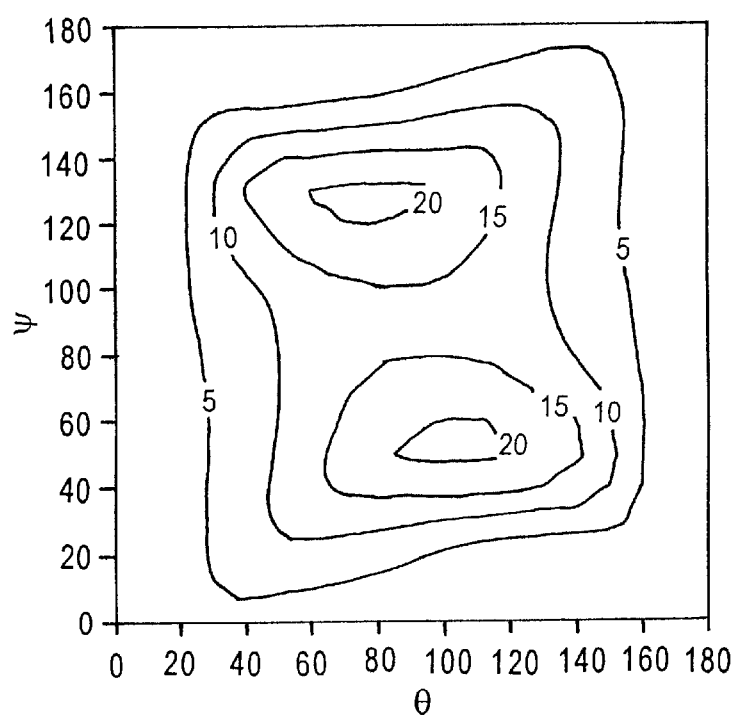
FIG. 19 is a contour-line graph showing the electromechanical coupling coefficient $K^2$ of the 1st-order mode when $kh_1$=1.2 and $\phi$=20°.

FIG. 19 is a contour-line graph delineating equivalent positions of electro-mechanical coupling coefficient $K^2$ on a system of orthogonal coordinates of $\theta$ and $\psi$ when $\phi$ is 20° and $kh_1$ is 1.2. This graph confirms the improvement of the electromechanical coupling coefficient $K^2$ in the sixth embodiment.

These examinations confirmed that the SAW device of the sixth embodiment has an improved electromechanical coupling coefficient $K^2$ as high as 20% while maintaining high propagation velocity. More specifically, the SAW device has a propagation velocity "v" of 7,000 m/s for a SAW of the 1st-order mode and has an electromechanical coupling coefficient $K^2$ of 20%.

Seventh Embodiment

The seventh embodiment has the same structure as the first and fourth embodiments as shown in FIG. 2. Distinct from the first and fourth embodiments, the seventh embodiment utilizes a SAW of the 2nd-order mode.

As with the first to sixth embodiments, the value of a desirable crystal orientation ($\theta$, $\psi$, $\phi$) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Tables 18 to 22 show the coordinate ($x_{i,j}$, $y_{i,j}$, $z_i$) of the vertex $P_{i,j}$ in the realm $V_i$ of the octagonal prism for $kh_1$'s values of 1.2, 1.4, 1.8, 2.4, and 3.0, respectively.

TABLE 18

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 81 | 120, 90 | 130, 85 | 140, 80 | 135, 70 | 130, 70 | 115, 70 | 110, 75 | 110, 90 | 70 |
| 82 | 120, 105 | 140, 95 | 155, 80 | 140, 65 | 120, 60 | 100, 65 | 90, 80 | 110, 95 | 80 |
| 83 | 120, 115 | 140, 110 | 150, 90 | 135, 70 | 115, 70 | 90, 70 | 90, 90 | 90, 115 | 90 |

TABLE 19

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 84 | 120, 95 | 140, 90 | 150, 70 | 135, 60 | 120, 55 | 105, 60 | 100, 75 | 95, 95 | 70 |
| 85 | 120, 100 | | 150, 80 | 135, 70 | 120, 65 | 100, 70 | 90, 90 | 100, 100 | 80 |
| 86 | 120, 110 | 145, 105 | 150, 90 | 135, 75 | 120, 70 | 90, 70 | | 90, 110 | 90 |

TABLE 20

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 87 | 130, 75 | 145, 75 | 155, 65 | 145, 60 | 135, 55 | 115, 50 | 105, 65 | 115, 85 | 60 |
| 88 | 130, 90 | 150, 85 | 160, 70 | | 125, 55 | 110, 55 | 100, 65 | 110, 85 | 70 |
| 89 | 130, 95 | 150, 90 | 150, 70 | 135, 60 | 100, 60 | 95, 70 | 85, 85 | 105, 95 | 80 |
| 90 | 125, 110 | 145, 105 | 150, 85 | 135, 75 | 110, 90 | 90, 75 | 90, 95 | 105, 105 | 90 |

TABLE 21

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 91 | 130, 70 | 145, 70 | 155, 60 | 150, 50 | 135, 50 | 120, 50 | 110, 60 | 105, 70 | 50 |
| 92 | 130, 80 | 150, 80 | 150, 60 | 140, 70 | 125, 45 | 100, 50 | 100, 65 | 115, 75 | 60 |
| 93 | 135, 90 | 150, 85 | 145, 65 | 140, 60 | 125, 50 | 105, 50 | 100, 70 | 110, 85 | 70 |
| 94 | 130, 95 | 150, 95 | 160, 70 | 145, 65 | 130, 60 | 110, 60 | 100, 75 | 105, 90 | 80 |
| 95 | 130, 90 | 150, 90 | 155, 80 | 145, 75 | 130, 70 | 120, 75 | 105, 80 | 115, 90 | 90 |

TABLE 22

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 96 | 140, 60 | 150, 60 | 150, 50 | 140, 50 | 135, 50 | 130, 50 | 120, 60 | 125, 60 | 40 |
| 97 | 135, 70 | 150, 65 | 155, 55 | 145, 50 | 130, 45 | 110, 45 | 105, 60 | 120, 70 | 50 |
| 98 | 120, 80 | 140, 75 | 155, 70 | 165, 50 | 140, 45 | 120, 35 | 100, 40 | 100, 60 | 60 |
| 99 | 125, 85 | 150, 85 | 160, 70 | 145, 55 | 130, 50 | 110, 40 | 100, 66 | 100, 80 | 70 |
| 100 | 95, 135 | 95, 150 | 75, 165 | 65, 150 | 60, 135 | 60, 115 | 80, 105 | 90, 120 | 80 |
| 101 | 130, 105 | 145, 105 | 155, 90 | 150, 80 | 135, 75 | 115, 75 | 110, 90 | 115, 105 | 90 |

When $kh_1$ is the value α that is larger than 1.2 and smaller than 3.0 and is not 1.4, 1.8, or 2.4, the coordinates of the individual vertexes $P_{i,j}$ and $P_{i+1,j}$ in the realm $V_i$ of the octagonal prism are obtained, as in the first to sixth embodiments, by a linear interpolation as expressed in equation (1) with the use of the coordinate values of the vertexes for the two values of $kh_1$ which has known coordinates of the vertexes, satisfies the formula a<α<b, and is nearest to α. Table 23 shows the values "m," "n," and "l" for the individual ranges of $kh_1$.

TABLE 23

| $kh_1$ | m | n | l |
|---|---|---|---|
| 1.2 < $kh_1$ < 1.4 | 81 | 84 | 240 |
|  | 82 | 85 | 241 |
|  | 83 | 86 | 242 |
| 1.4 < $kh_1$ < 1.8 | 84 | 88 | 243 |
|  | 85 | 89 | 244 |
|  | 86 | 90 | 245 |
| 1.8 < $kh_1$ < 2.4 | 87 | 92 | 246 |
|  | 88 | 93 | 247 |
|  | 89 | 94 | 248 |
|  | 90 | 95 | 249 |
| 2.4 < $kh_1$ < 3.0 | 91 | 97 | 250 |
|  | 92 | 98 | 251 |
|  | 93 | 99 | 252 |
|  | 94 | 100 | 253 |
|  | 95 | 101 | 254 |

As with the first to sixth embodiments, various SAW devices were fabricated to evaluate the propagation velocity "v" and the electromechanical coupling coefficient $K^2$.

Figure 20A:
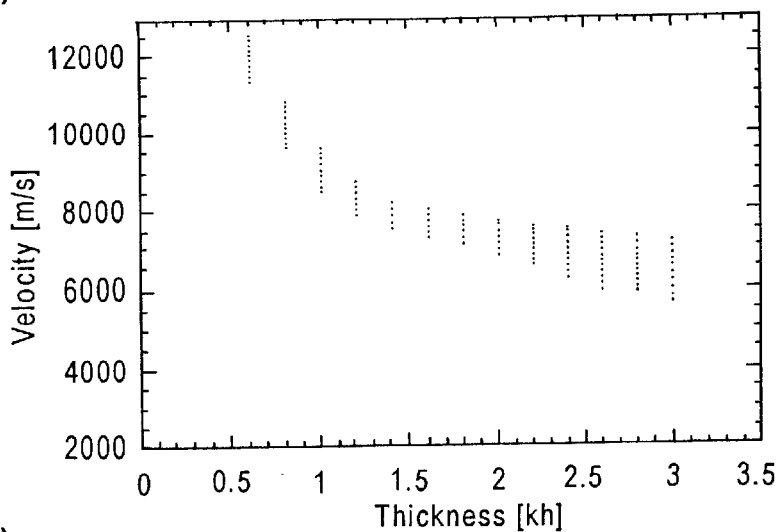
FIGS. 20(a) to 20(c) are graphs showing the relation between $kh_1$ and the propagation velocity "v" of the SAW of the 2nd-order mode.
Figure 20B:
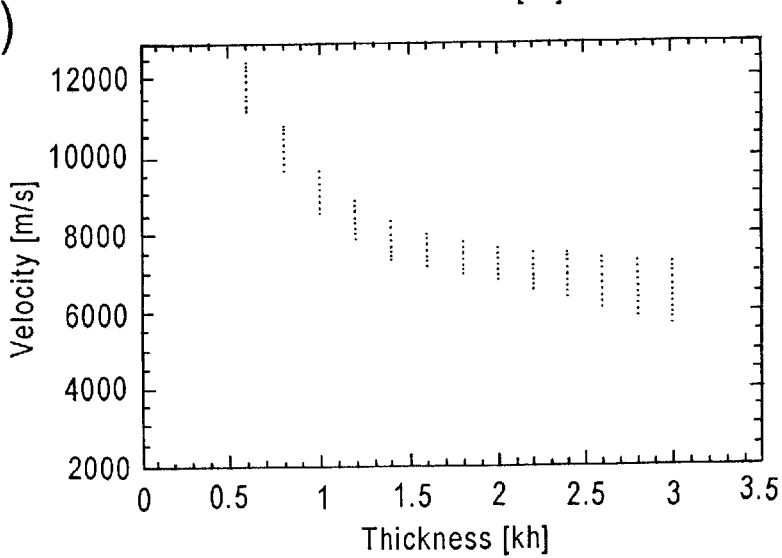
Figure 20C:
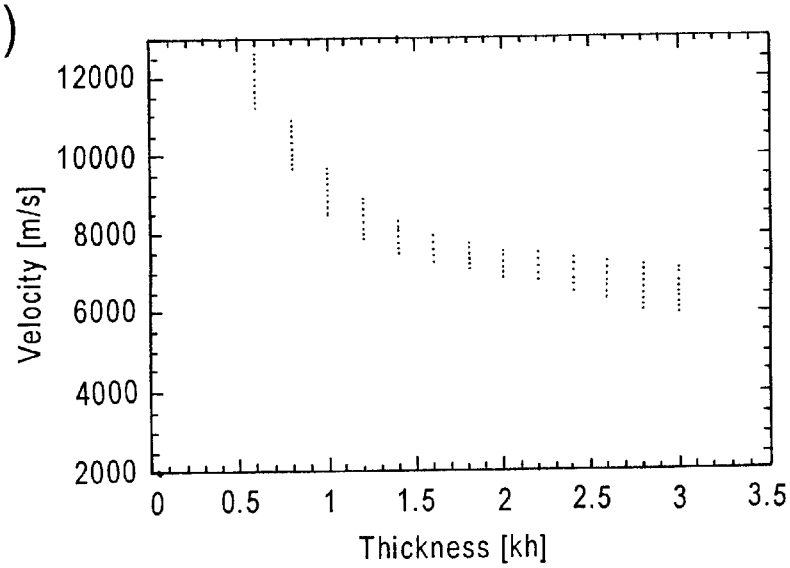
Figure 21:
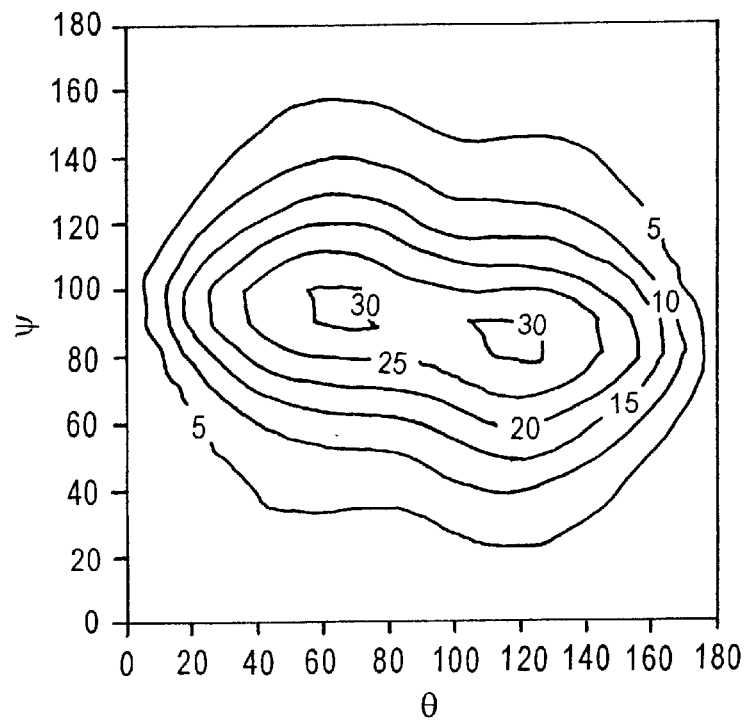
FIG. 21 is a contour-line graph showing the electromechanical coupling coefficient $K^2$ of the 2nd-order mode when $kh_1 = 1.2$ and $\phi = 80°$.
Figure 22:
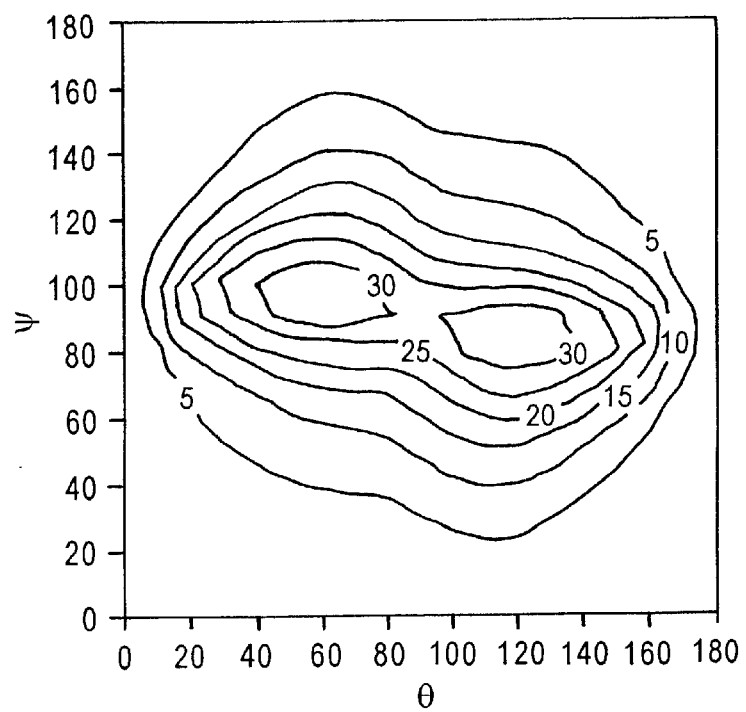
FIG. 22 is a contour-line graph showing the electromechanical coupling coefficient $K^2$ of the 2nd-order mode when $kh_1 = 1.4$ and $\phi = 80°$.
Figure 23:
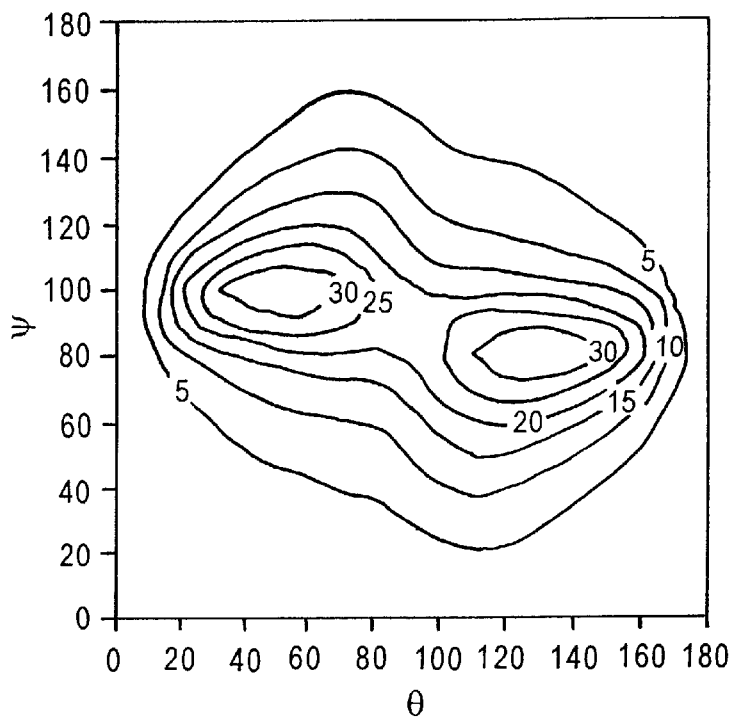
FIG. 23 is a contour-line graph showing the electromechanical coupling coefficient $K^2$ of the 2nd-order mode when $kh_1 = 1.8$ and $\phi = 80°$.
Figure 24:
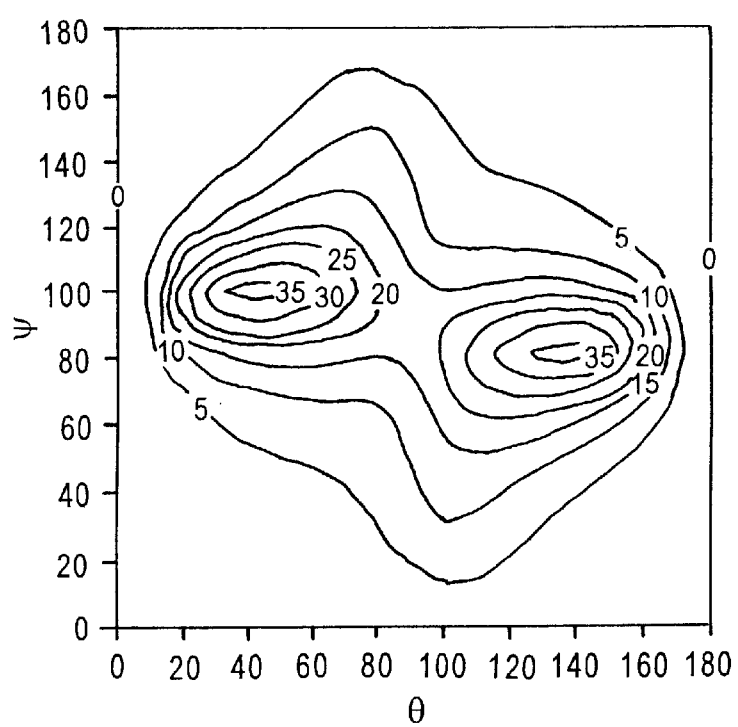
FIG. 24 is a contour-line graph showing the electromechanical coupling coefficient $K^2$ of the 2nd-order mode when $kh_1 = 2.4$ and $\phi = 80°$.
Figure 25:
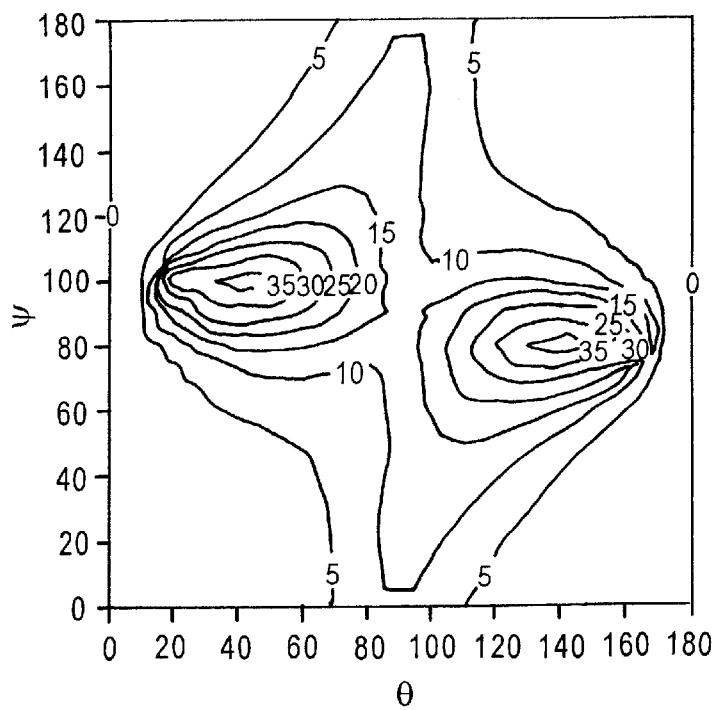
FIG. 25 is a contour-line graph showing the electromechanical coupling coefficient $K^2$ of the 2nd-order mode when $kh_1 = 3.0$ and $\phi = 80°$.
Figure 26:
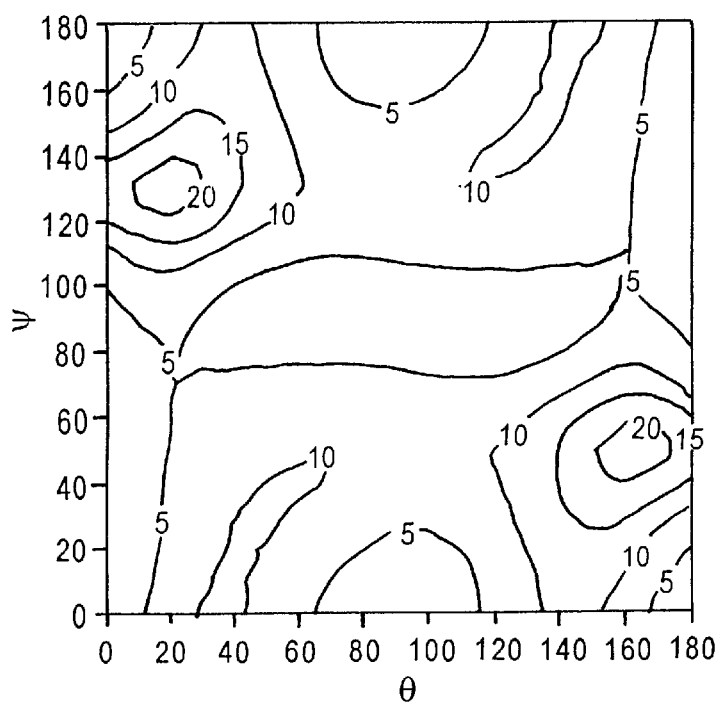
FIG. 26 is a contour-line graph showing the electromechanical coupling coefficient $K^2$ of the 2nd-order mode when $kh_1 = 0.6$ and $\phi = 50°$.
Figure 27:
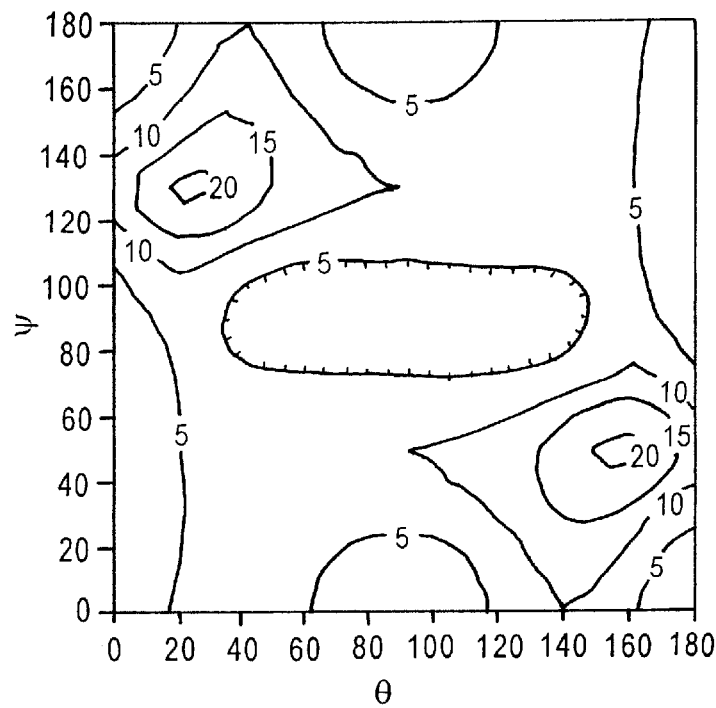
FIG. 27 is a contour-line graph showing the electromechanical coupling coefficient $K^2$ of the 2nd-order mode when $kh_1 = 0.8$ and $\phi = 50°$.
Figure 28:
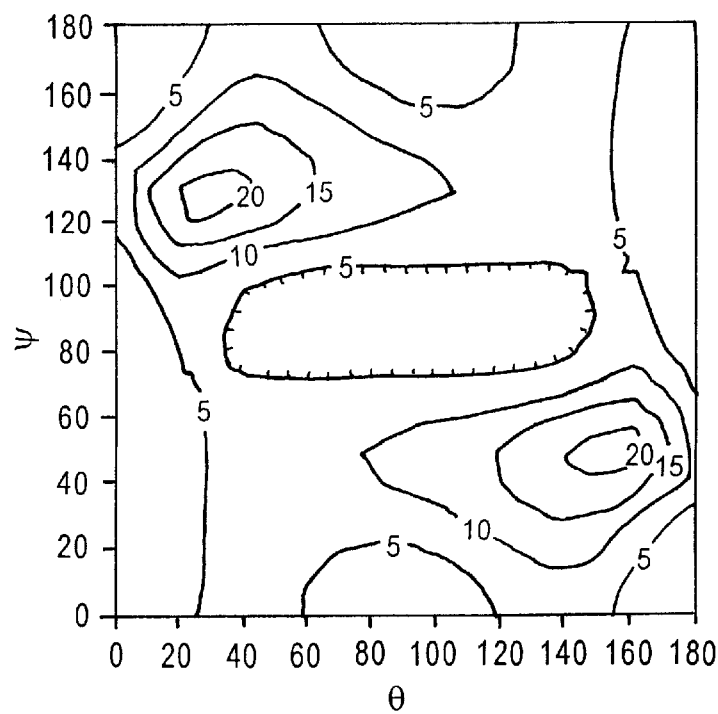
FIG. 28 is a contour-line graph showing the electromechanical coupling coefficient $K^2$ of the 2nd-order mode when $kh_1 = 1.0$ and $\phi = 50°$.
Figure 29:
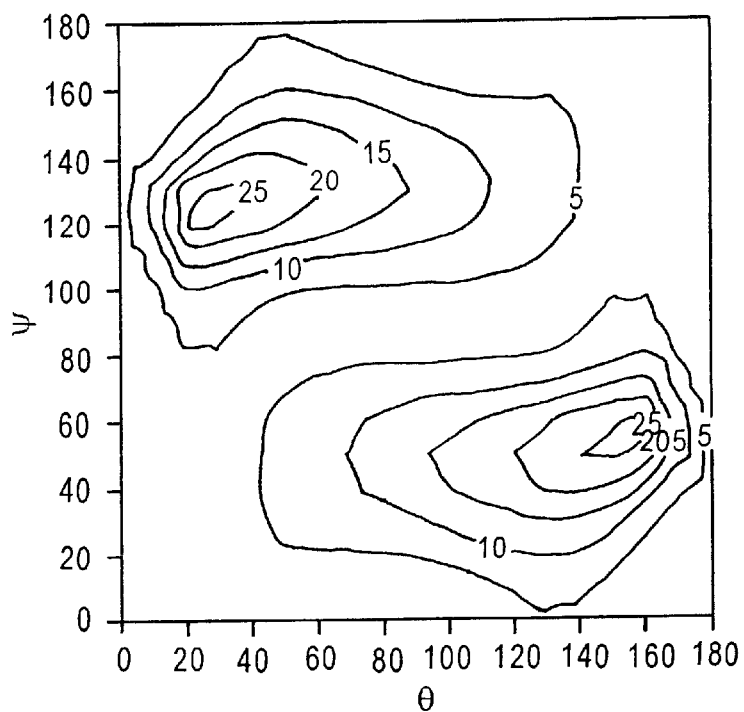
FIG. 29 is a contour-line graph showing the electromechanical coupling coefficient $K^2$ of the 2nd-order mode when $kh_1 = 1.2$ and $\phi = 50°$.
Figure 30:
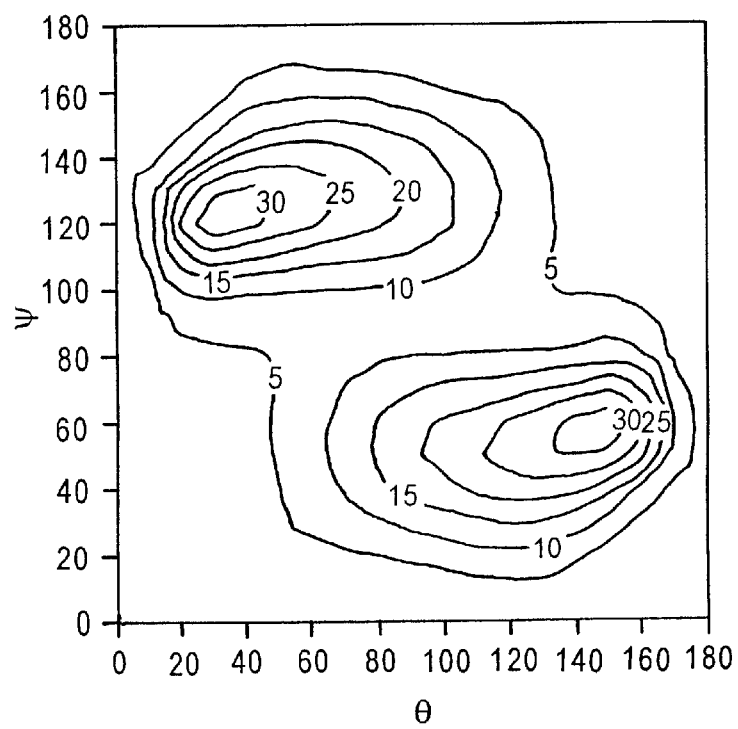
FIG. 30 is a contour-line graph showing the electromechanical coupling coefficient $K^2$ of the 2nd-order mode when $kh_1 = 1.4$ and $\phi = 50°$.
Figure 31:
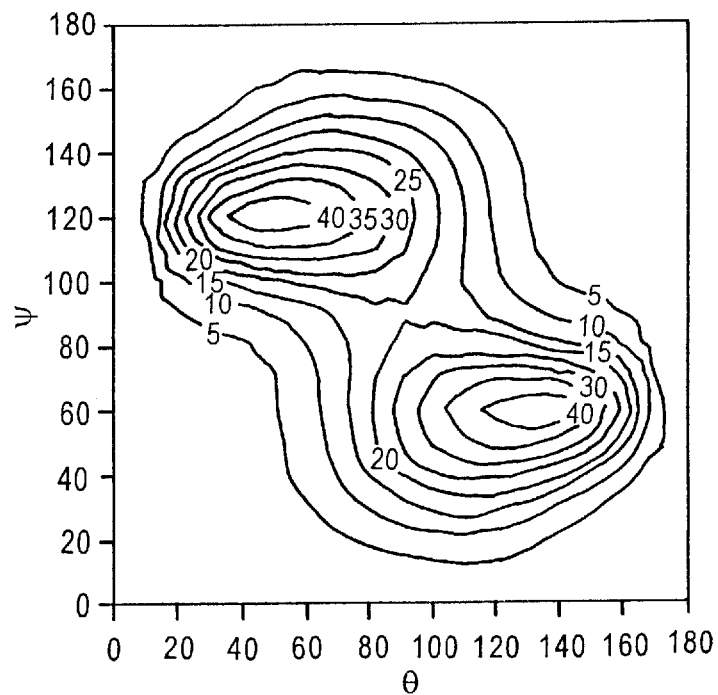
FIG. 31 is a contour-line graph showing the electromechanical coupling coefficient $K^2$ of the 2nd-order mode when $kh_1 = 1.8$ and $\phi = 50°$.
Figure 32:
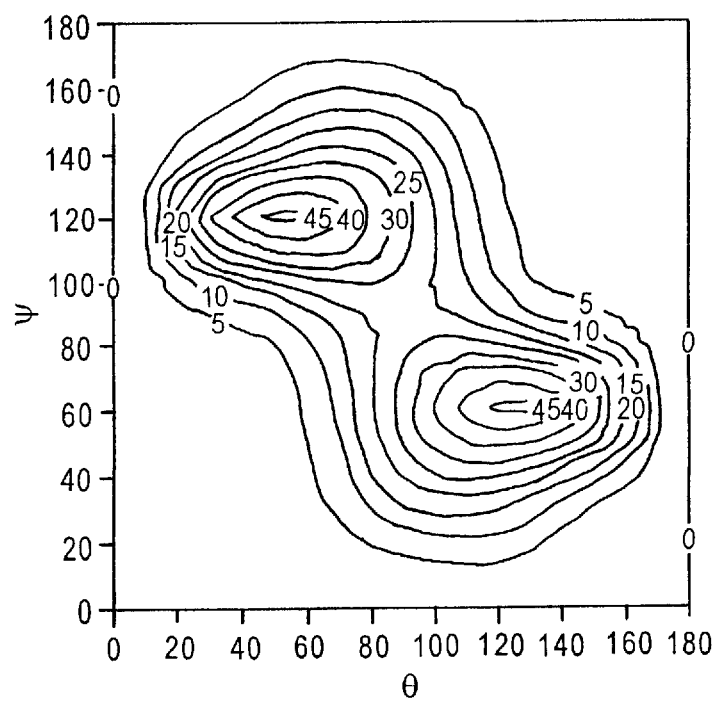
FIG. 32 is a contour-line graph showing the electromechanical coupling coefficient $K^2$ of the 2nd-order mode when $kh_1 = 2.4$ and $\phi = 50°$.
Figure 33:
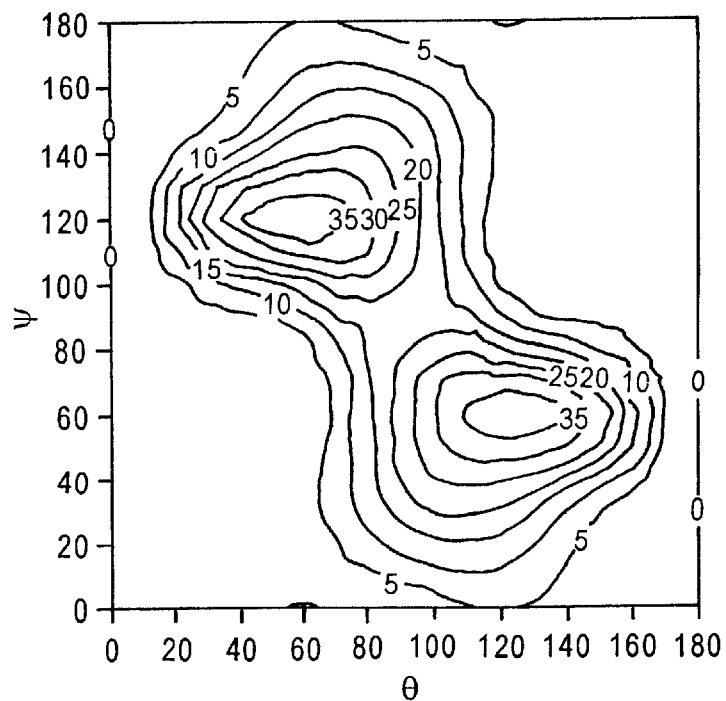
FIG. 33 is a contour-line graph showing the electromechanical coupling coefficient $K^2$ of the 2nd-order mode when $kh_1 = 3.0$ and $\phi = 50°$.
Figure 34:
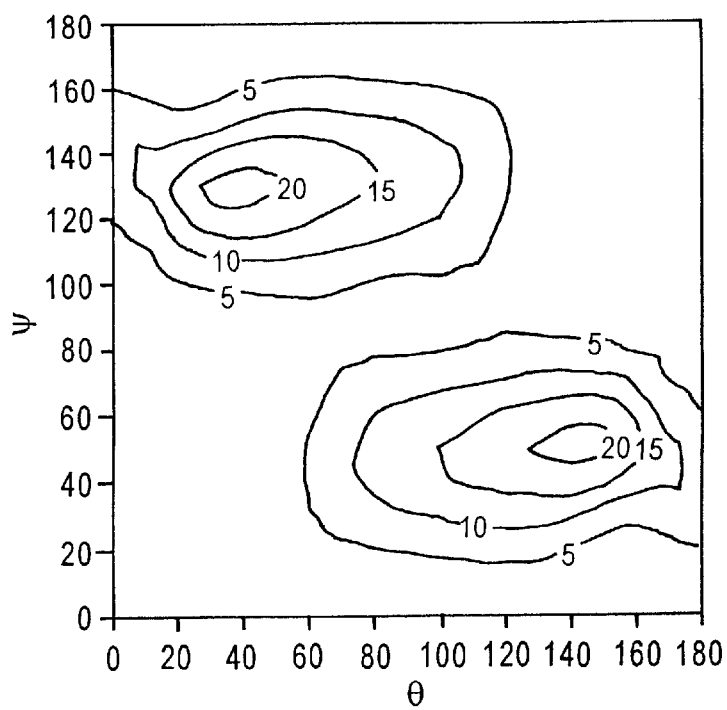
FIG. 34 is a contour-line graph showing the electromechanical coupling coefficient $K^2$ of the 2nd-order mode when $kh_1 = 1.4$ and $\phi = 40°$.
Figure 35:
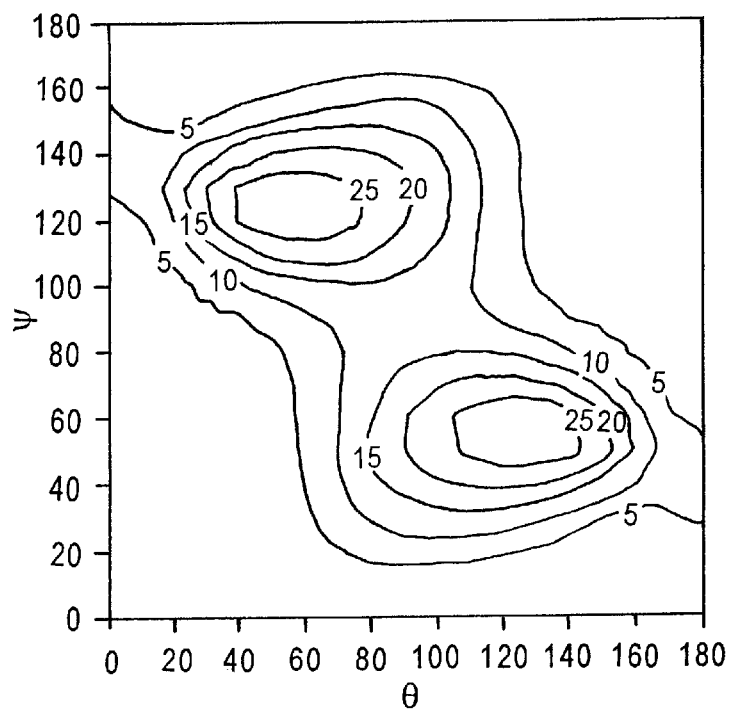
FIG. 35 is a contour-line graph showing the electromechanical coupling coefficient $K^2$ of the 2nd-order mode when $kh_1 = 1.8$ and $\phi = 40°$.
Figure 36:
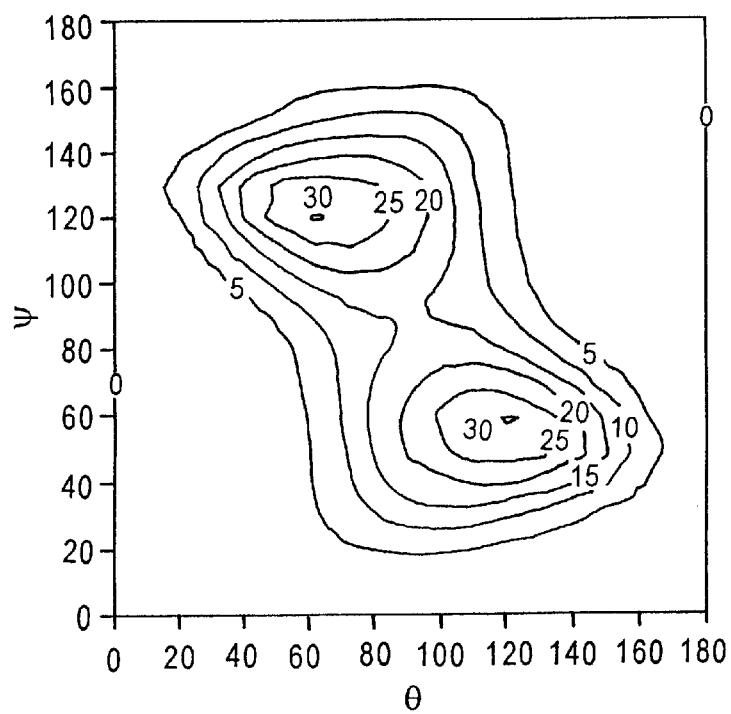
FIG. 36 is a contour-line graph showing the electromechanical coupling coefficient $K^2$ of the 2nd-order mode when $kh_1 = 2.4$ and $\phi = 40°$.
Figure 37:
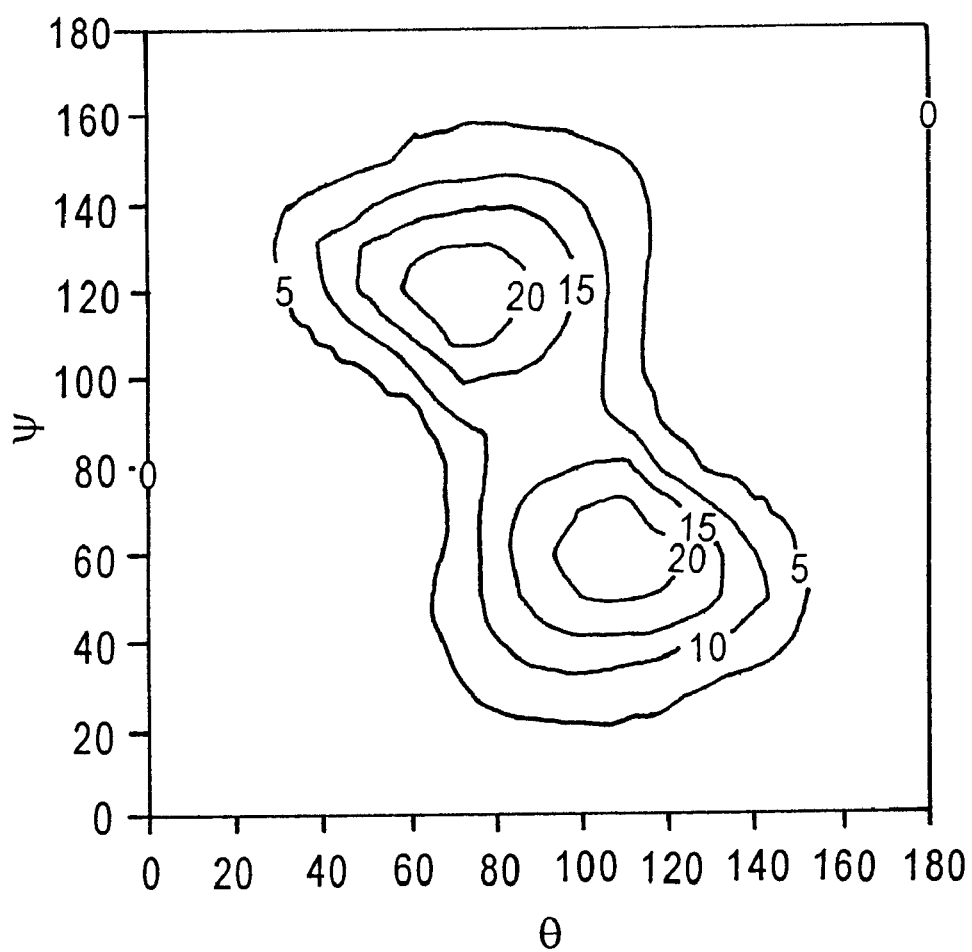
FIG. 37 is a contour-line graph showing the electromechanical coupling coefficient $K^2$ of the 2nd-order mode when $kh_1 = 3.0$ and $\phi = 40°$.

The results revealed that the propagation velocity "v" of the 2nd-order mode also varies with ϕ and $kh_1$ and that in particular, it increases with decreasing $kh_1$. FIGS. 20(a) to 20(c) are showing the relation between the propagation velocity of the 2nd-order mode and $kh_1$. FIG. 20(a) shows the relation for 0°≦ϕ≦30°, FIG. 20(b) for 40°≦ϕ≦60°, and FIG. 20(c) for 70°≦ϕ≦90°. These figures confirm that $kh_1$ is required to be 3.0 or less in order to achieve a propagation velocity as high as 5,000 m/s or more.

FIGS. 21 to 25 are contour-line graphs delineating equivalent positions of the electromechanical coupling coefficient $K^2$ on a system of orthogonal coordinates of θ and ψ for ϕ's value of 80° and $kh_1$'s values of 1.2, 1.4, 1.8, 2.4, and 3.0, respectively. These graphs confirm the improvement of the electromechanical coupling coefficient $K^2$ in the seventh embodiment.

These examinations confirmed that the SAW device of the seventh embodiment has an improved electromechanical coupling coefficient $K^2$ as high as 20% or more while maintaining high propagation velocity. More specifically, the SAW device has a propagation velocity "v" of 6,000 to 8,500 m/s for a SAW in the 2nd-order mode and has an electromechanical coupling coefficient $K^2$ of 20 to 35%.

Eighth Embodiment

The eighth embodiment has the same structure as the second and fifth embodiments as shown in FIG. 8. Distinct from the second and fifth embodiments, the eighth embodiment utilizes a SAW of the 2nd-order mode.

As with the first to seventh embodiments, the value of a desirable crystal orientation (θ, ψ, ϕ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Tables 24 to 31 show the coordinate ($x_{i,j}, y_{i,j}, z_i$) of the vertex $P_{i,j}$ in the realm $V_i$ of the octagonal prism for $kh_1$'s values of 0.6, 0.8, 1.0, 1.2, 1.4, 1.8, 2.4, and 3.0, respectively.

TABLE 24

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 102 | 165, 10 | 170, 10 | 170, 5 | 170, 5 | 165, 5 | 160, 5 | 160, 10 | 160, 15 | 10 |
| 103 |  |  |  |  |  |  |  |  | 20 |
| 104 | 165, 30 | 170, 20 | 170, 20 | 165, 10 | 160, 10 | 155, 15 | 155, 20 | 160, 25 | 30 |
| 105 | 160, 50 | 170, 45 | 175, 40 | 170, 35 | 160, 30 | 155, 30 | 150, 35 | 155, 40 | 40 |
| 106 | 160, 55 | 170, 55 | 170, 50 | 170, 45 | 165, 45 | 160, 40 | 150, 45 | 155, 55 | 50 |
| 107 | 165, 65 | 170, 65 | 175, 60 | 170, 55 | 165, 50 | 155, 50 | 150, 55 | 155, 60 | 60 |
| 108 | 160, 75 | 170, 75 | 175, 70 | 170, 65 | 165, 60 | 160, 60 | 155, 65 | 155, 70 | 70 |
| 109 | 160, 85 | 170, 85 | 175, 80 | 175, 75 | 165, 70 | 150, 70 | 140, 75 | 150, 80 | 80 |

TABLE 25

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 110 | 155, 55 | 160, 50 | 165, 50 | 160, 50 | 155, 45 | 150, 50 | 150, 55 | 155, 55 | 50 |
| 111 | 155, 65 | 165, 60 | 165, 55 |  | 155, 50 | 150, 50 | 145, 55 | 150, 60 | 60 |

TABLE 25-continued

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 112 | 160, 70 | 160, 65 | 170, 60 | 165, 60 | 155, 60 | 150, 60 | 150, 65 | 155, 70 | 70 |
| 113 | 150, 85 | 165, 80 | 170, 75 | 165, 75 | 160, 75 | 155, 75 | 150, 80 | 155, 85 | 80 |

TABLE 26

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 114 | 150, 55 | 160, 45 | 165, 40 | 160, 40 | 150, 40 | 145, 45 | 140, 50 | 145, 50 | 50 |
| 115 | 150, 65 | 160, 65 | 165, 65 | 160, 50 | 150, 50 | 140, 50 | 130, 50 | 140, 60 | 60 |
| 116 | 145, 75 | 160, 80 | 165, 70 | 160, 65 | 150, 60 | 140, 55 | 130, 60 | 160, 70 | 70 |
| 117 | 155, 85 | 165, 85 | 170, 75 | 160, 75 | 150, 75 | 145, 75 | 135, 75 | 135, 85 | 80 |

TABLE 27

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 118 | 150, 50 | 160, 40 | 160, 35 | 155, 30 | 150, 30 | 145, 35 | 140, 40 | 145, 45 | 30 |
| 119 | 150, 60 | 160, 35 | 160, 50 | 160, 40 | 150, 35 | 110, 110 | 130, 60 | 140, 65 | 40 |
| 120 | 145, 60 | 160, 65 | 165, 50 | 155, 45 | 140, 46 | 130, 40 | 120, 50 | 130, 60 | 50 |
| 121 | 140, 70 | 160, 75 | 165, 55 | 150, 50 | 135, 40 | 120, 45 | 110, 55 | 130, 70 | 60 |
| 122 | 145, 75 | 160, 85 | 170, 75 | 160, 65 | 150, 50 | 125, 45 | 110, 60 | 115, 75 | 70 |
| 123 | 140, 85 | 160, 90 | 170, 75 |  | 150, 60 | 130, 50 | 120, 60 | 125, 80 | 80 |

TABLE 28

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 124 | 140, 45 | 145, 40 | 150, 35 | 150, 35 | 140, 30 | 140, 30 | 135, 35 | 135, 40 | 10 |
| 125 | 145, 50 | 155, 45 | 160, 40 | 155, 25 | 145, 20 | 135, 30 | 130, 35 | 135, 50 | 20 |
| 126 | 145, 60 | 160, 55 | 165, 50 | 160, 35 | 145, 30 | 130, 35 | 120, 45 | 130, 45 | 30 |
| 127 | 140, 60 | 155, 60 |  | 145, 40 | 125, 30 | 110, 30 | 100, 40 | 120, 55 | 40 |
| 128 | 130, 70 | 155, 70 | 165, 60 | 150, 45 | 130, 35 | 110, 40 | 90, 50 | 110, 65 | 50 |
| 129 | 125, 80 | 156, 85 | 160, 80 | 150, 50 | 130, 30 | 100, 40 | 90, 55 | 110, 70 | 60 |

TABLE 29

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 130 | 90, 70 | 125, 65 | 140, 40 | 125, 25 | 90, 30 | 60, 25 | 50, 60 | 70, 70 | 0 |
| 131 | 100, 95 | 130, 90 | 150, 45 | 130, 25 | 160, 30 |  | 50, 55 | 70, 90 | 10 |
| 132 | 105, 70 | 135, 65 | 150, 50 | 140, 30 | 130, 30 | 80, 30 | 55, 40 | 70, 70 | 20 |
| 133 | 115, 78 | 140, 70 | 160, 50 | 145, 25 | 120, 30 | 85, 35 | 65, 55 | 90, 75 | 30 |
| 134 | 120, 80 | 150, 70 |  | 145, 40 |  | 90, 35 | 75, 50 | 85, 80 | 40 |
| 135 | 130, 80 | 150, 80 | 160, 60 | 150, 40 | 125, 45 | 100, 50 | 80, 70 | 85, 85 | 50 |
| 136 | 125, 80 | 145, 80 |  | 140, 50 | 120, 45 | 105, 45 | 90, 60 | 100, 80 | 60 |
| 137 | 130, 90 | 160, 70 | 145, 55 | 125, 45 | 100, 50 | 90, 70 | 85, 85 | 110, 90 | 70 |
| 138 | 130, 95 | 155, 95 | 165, 80 | 140, 65 | 120, 60 | 100, 65 |  | 110, 95 | 80 |
| 139 | 125, 110 | 150, 105 | 155, 90 | 140, 75 | 115, 70 | 90, 80 | 90, 100 | 110, 110 | 90 |

TABLE 30

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 140 | 90, 90 | 115, 75 | 135, 55 | 130, 30 | 90, 30 | 50, 30 | 45, 50 | 60, 75 | 0 |
| 141 |  | 115, 80 | 135, 60 |  | 100, 30 | 65, 30 | 50, 50 | 65, 75 | 10 |
| 142 | 190, 90 | 120, 80 | 135, 65 | 140, 30 | 110, 30 | 70, 30 | 55, 50 |  | 20 |
| 143 | 90, 90 | 115, 80 | 140, 65 | 150, 40 | 125, 30 | 100, 50 | 70, 40 | 65, 65 | 30 |
| 144 |  | 130, 80 | 155, 65 |  | 120, 50 | 90, 30 | 70, 50 | 75, 75 | 40 |
| 145 | 125, 80 | 155, 75 | 150, 55 | 130, 40 | 110, 35 | 90, 45 | 85, 65 | 105, 85 | 50 |
| 146 | 110, 90 | 140, 85 | 180, 65 | 140, 45 | 115, 35 |  | 85, 60 | 85, 85 | 60 |
| 147 | 130, 90 | 150, 90 | 160, 70 | 140, 55 | 115, 45 | 95, 55 | 70, 70 | 100, 90 | 70 |
| 148 | 130, 95 | 155, 90 | 150, 70 | 130, 60 | 110, 60 | 95, 75 | 115, 90 | 110, 95 | 80 |
| 149 | 130, 110 | 150, 105 | 155, 90 | 150, 75 | 130, 75 | 110, 75 | 100, 90 | 110, 105 | 90 |

TABLE 31

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 150 | 90, 90 | 110, 70 | 130, 50 | 120, 30 | 90, 30 | 60, 30 | 50, 50 | 70, 70 | 0 |
| 151 |  | 115, 70 | 130, 55 | 130, 30 | 100, 30 | 70, 30 | 60, 50 | 70, 75 | 10 |
| 152 | 90, 80 | 120, 70 | 140, 55 | 125, 30 |  | 75, 30 |  | 75, 70 | 20 |
| 153 | 100, 75 | 125, 70 | 150, 50 | 140, 35 | 115, 35 | 85, 35 | 70, 50 | 80, 70 | 30 |
| 154 | 110, 80 | 135, 70 | 155, 60 | 140, 40 | 120, 35 | 90, 35 | 80, 55 | 90, 75 | 40 |
| 155 | 110, 85 | 125, 75 | 155, 65 | 150, 45 | 125, 35 | 100, 30 | 90, 45 | 90, 65 | 50 |
| 156 | 115, 85 | 145, 75 | 165, 65 | 145, 50 | 125, 40 | 105, 30 | 90, 50 | 90, 70 | 60 |
| 157 | 130, 90 | 155, 85 | 170, 55 | 155, 65 | 130, 50 | 105, 50 | 95, 70 | 105, 85 | 70 |
| 158 | 135, 95 | 145, 90 | 165, 75 | 150, 65 | 130, 60 | 110, 65 | 100, 80 | 110, 90 | 80 |
| 159 | 130, 105 | 150, 100 | 155, 90 | 145, 75 | 130, 75 | 115, 75 | 110, 90 | 115, 105 | 90 |

When $kh_1$ is the value α that is larger than 0.6 and smaller than 3.0 and is not 0.8, 1.0, 1.2, 1.4, 1.8, or 2.4, the coordinates of the individual vertexes $P_{i,j}$ and $P_{i+1,j}$ in the realm $V_i$ of the octagonal prism are obtained, as in the first to seventh embodiments, by a linear interpolation as expressed in equation (1) with the use of the coordinate values of the vertexes for the two values of $kh_1$ which has known coordinates of the vertexes, satisfies the formula a<α<b, and is nearest to α. Table 32 shows the values "m," "n," and "l" for the individual ranges of $kh_1$.

TABLE 32

| $kh_1$ | m | n | l |
|---|---|---|---|
| 0.6 < $kh_1$ < 0.8 | 106 | 110 | 255 |
|  | 107 | 111 | 256 |
|  | 108 | 112 | 257 |
|  | 109 | 113 | 258 |
| 0.8 < $kh_1$ < 1.0 | 110 | 114 | 259 |
|  | 111 | 115 | 260 |
|  | 112 | 116 | 261 |
|  | 113 | 117 | 262 |
| 1.0 < $kh_1$ < 1.2 | 114 | 120 | 263 |
|  | 115 | 121 | 264 |
|  | 116 | 122 | 265 |
|  | 117 | 123 | 266 |
| 1.2 < $kh_1$ < 1.4 | 118 | 126 | 267 |
|  | 119 | 127 | 268 |
|  | 120 | 128 | 269 |
|  | 121 | 129 | 270 |
| 1.4 < $kh_1$ < 1.8 | 124 | 131 | 271 |
|  | 125 | 132 | 272 |
|  | 126 | 133 | 273 |
|  | 127 | 134 | 274 |
|  | 128 | 135 | 275 |
|  | 129 | 136 | 276 |
| 1.8 < $kh_1$ < 2.4 | 130 | 140 | 277 |
|  | 131 | 141 | 278 |
|  | 132 | 142 | 279 |
|  | 133 | 143 | 280 |
|  | 134 | 144 | 281 |
|  | 135 | 145 | 282 |
|  | 136 | 146 | 283 |
|  | 137 | 147 | 284 |
|  | 138 | 148 | 285 |
|  | 139 | 149 | 286 |
| 2.4 < $kh_1$ < 3.0 | 140 | 150 | 287 |
|  | 141 | 151 | 288 |
|  | 142 | 152 | 289 |
|  | 143 | 153 | 290 |
|  | 144 | 154 | 291 |
|  | 145 | 155 | 292 |
|  | 146 | 156 | 293 |
|  | 147 | 157 | 294 |
|  | 148 | 158 | 295 |
|  | 149 | 159 | 296 |

As with the first to seventh embodiments, various SAW devices were fabricated to evaluate the propagation velocity "v" and the electromechanical coupling coefficient $K^2$. The measured results of the propagation velocity "v" can be explained by the same description as in the seventh embodiment without alteration, and hence the explanation is omitted.

FIGS. 26 to 33 are contour-line graphs delineating equivalent positions of the electromechanical coupling coefficient $K^2$ on a system of orthogonal coordinates of θ and ψ for φ's value of 50° and $kh_1$'s values of 0.6, 0.8, 1.0, 1.2, 1.4, 1.8, 2.4, and 3.0, respectively. These graphs confirm the improvement of the electromechanical coupling coefficient $K^2$ in the eighth embodiment.

These examinations confirmed that the SAW device of the eighth embodiment has an improved electromechanical coupling coefficient $K^2$ as high as 20% or more while maintaining high propagation velocity. More specifically, the SAW device has a propagation velocity "v" of 6,000 to 12,000 m/s for a SAW of the 2nd-order mode and has an electromechanical coupling coefficient $K_2$ of 20 to 45%.

Ninth Embodiment

The ninth embodiment has the same structure as the third and sixth embodiments as shown in FIG. 12. Distinct from the third and sixth embodiments, the ninth embodiment utilizes a SAW of the 2nd-order mode.

As with the first to eighth embodiments, the value of a desirable crystal orientation (θ, ψ, φ) for the specified value of $kh_1$ can be represented by the internal realm of the realm $V_i$ of the octagonal prism having 16 vertexes $P_{i,j}$ and $P_{i+1,j}$, where "j" represents integers from 1 to 8.

Tables 33 to 36 show the coordinate ($x_{i,j}, y_{i,j}, z_i$) of the vertex $P_{i,j}$ in the realm $V_i$ of the octagonal prism for $kh_1$'s values of 1.4, 1.8, 2.4, and 3.0, respectively.

TABLE 33

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 160 | 145, 50 | 150, 45 | 155, 40 | 150, 40 | 145, 40 | 140, 40 | 140, 45 | 140, 50 | 30 |
| 161 |  | 150, 50 | 155, 45 | 150, 45 |  |  | 135, 40 | 135, 50 | 40 |
| 162 | 140, 60 | 150, 60 | 150, 55 | 150, 50 | 140, 50 | 130, 50 | 125, 55 | 130, 60 | 50 |
| 163 | 140, 70 | 145, 70 | 145, 60 | 145, 55 | 140, 55 | 130, 55 | 125, 60 | 130, 65 | 60 |

TABLE 34

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 164 | 90, 60 | 120, 60 | 130, 45 | 120, 30 | 90, 35 | 65, 30 | 50, 45 | 70, 60 | 0 |
| 165 | 100, 60 | 125, 60 | 140, 40 | 130, 30 | 105, 35 | 85, 35 | 60, 35 |  | 10 |
| 166 | 110, 65 | 130, 60 | 150, 40 |  | 110, 35 | 80, 35 | 70, 55 | 90, 60 | 20 |
| 167 | 120, 65 | 140, 60 | 150, 50 | 140, 35 | 120, 35 | 90, 40 | 85, 50 | 100, 65 | 30 |
| 168 | 120, 70 | 140, 65 |  | 140, 40 | 120, 40 | 110, 40 | 90, 45 | 90, 65 | 40 |
| 169 | 125, 75 | 145, 70 | 150, 60 | 140, 50 | 125, 45 | 105, 45 | 95, 60 | 105, 80 | 50 |
| 170 | 130, 75 | 140, 70 | 150, 65 | 140, 60 | 130, 55 | 120, 55 | 110, 60 | 115, 65 | 60 |

TABLE 35

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 171 | 90, 70 | 115, 65 | 130, 50 | 125, 30 | 90, 30 | 55, 30 | 50, 50 | 65, 65 | 0 |
| 172 | 100, 70 | 125, 65 | 135, 50 | 130, 30 | 100, 30 | 65, 30 | 60, 50 | 80, 70 | 10 |
| 173 | 100, 75 | 120, 70 | 140, 55 | 130, 50 | 115, 50 | 85, 50 | 65, 45 | 75, 65 | 20 |
| 174 | 110, 70 | 130, 65 | 140, 50 | 140, 35 | 115, 35 | 90, 35 | 80, 55 | 90, 70 | 30 |
| 175 | 110, 95 | 130, 90 | 145, 60 | 140, 50 | 120, 40 | 115, 40 | 90, 45 |  | 40 |
| 176 | 125, 75 | 130, 70 | 140, 60 | 130, 50 | 120, 50 | 115, 50 | 100, 60 | 105, 75 | 50 |
| 177 | 125, 70 |  | 135, 65 | 130, 65 | 125, 65 | 125, 65 | 115, 65 | 115, 70 | 60 |

TABLE 36

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 178 | 90, 70 | 110, 70 | 120, 60 | 120, 35 | 90, 30 | 65, 35 | 60, 55 | 70, 75 | 0 |
| 179 | 95, 70 | 110, 65 | 130, 50 | 110, 35 | 95, 35 | 70, 35 | 65, 50 | 75, 65 | 10 |
| 180 | 100, 70 | 120, 65 | 125, 55 | 125, 45 | 110, 35 | 90, 35 | 70, 50 | 80, 60 | 20 |
| 181 | 110, 70 |  | 130, 50 | 120, 40 | 110, 40 | 95, 40 | 85, 50 | 90, 70 | 30 |
| 182 |  | 115, 65 | 125, 55 | 115, 50 | 110, 50 | 100, 50 | 95, 55 | 100, 75 | 40 |

When $kh_1$ is the value $\alpha$ that is larger than 1.4 and smaller than 3.0 and is not 1.8 or 2.4, the coordinates of the individual vertexes $P_{i,j}$ and $P_{i+1,j}$ in the realm $V_i$ of the octagonal prism are obtained, as in the first to eighth embodiments, by a linear interpolation as expressed in equation (1) with the use of the coordinate values of the vertexes for the two values of $kh_1$ which has known coordinates of the vertexes, satisfies the formula $a < \alpha < b$, and is nearest to $\alpha$. Table 37 shows the values "m," "n," and "l" for the individual ranges of $kh_1$.

TABLE 37

| $kh_1$ | m | n | l |
|---|---|---|---|
| $1.4 < kh_1 < 1.8$ | 160 | 167 | 297 |
|  | 161 | 168 | 298 |
|  | 162 | 169 | 299 |
|  | 163 | 170 | 300 |
| $1.8 < kh_1 < 2.4$ | 164 | 171 | 301 |
|  | 165 | 172 | 302 |
|  | 166 | 173 | 303 |
|  | 167 | 174 | 304 |
|  | 168 | 175 | 305 |
|  | 169 | 176 | 306 |
| $2.4 < kh_1 < 3.0$ | 170 | 177 | 307 |
|  | 171 | 178 | 308 |
|  | 172 | 179 | 309 |
|  | 173 | 180 | 310 |
|  | 174 | 181 | 311 |
|  | 175 | 182 | 312 |

As with the first to eighth embodiments, various SAW devices were fabricated to evaluate the propagation velocity "v" and the electromechanical coupling coefficient $K^2$. The measured results of the propagation velocity "v" can be explained by the same description as in the seventh embodiment without alteration, and hence the explanation is omitted.

FIGS. 34 to 37 are contour-line graphs delineating equivalent positions of the electromechanical coupling coefficient $K^2$ on a system of orthogonal coordinates of $\theta$ and $\psi$ for $\phi$'s values of 40° and $kh_1$'s values of 1.4, 1.8, 2.4, and 3.0, respectively. These graphs confirm the improvement of the electromechanical coupling coefficient $K^2$ in the ninth embodiment.

These examinations confirmed that the SAW device of the ninth embodiment has an improved electromechanical coupling coefficient $K^2$ as high as 20% or more while maintaining high propagation velocity. More specifically, the SAW device has a propagation velocity "v" of 6,000 to 8,000 m/s for a SAW of the 2nd-order mode and has an electromechanical coupling coefficient $K^2$ of 20 to 30%.

What is claimed is:

1. A SAW device that utilizes a SAW of the 0th-order mode comprising a diamond substrate, a $KNbO_3$ layer formed on the diamond substrate, and IDTs, wherein:

(a) the IDTs are formed on the $KNbO_3$ layer;

(b) a short-circuiting electrode is provided between the $KNbO_3$ layer and the diamond substrate; and (c) the $KNbO_3$ layer is composed of a single crystal having a layer thickness $t_1$ and a crystal orientation ($\theta$, $\psi$, $\phi$) as defined in the following Tables and equations: a coordinate (x, y, z) which represents the crystal orientation ($\theta$, $\psi$, $\phi$) within a realm $V_n$ of an octagonal prism having opposite octagonal planes, one of which has eight vertexes represented by ($x_{n,1}$, $y_{n,1}$, $z_n$), ($x_{n,2}$, $y_{n,2}$, $z_n$), ($x_{n,3}$, $y_{n,3}$, $z_n$), ($x_{n,4}$, $y_{n,4}$, $z_n$), ($x_{n,5}$, $y_{n,5}$, $z_n$), ($x_{n,6}$, $y_{n,6}$, $z_n$), ($x_{n,7}$, $y_{n,7}$, $z_n$), ($x_{n,8}$, $y_{n,8}$, $z_n$) and the other of which has eight vertexes represented by ($x_{n+1,1}$, $y_{n+1,1}$, $z_{n+1}$), ($x_{n+1,2}$, $y_{n+1,2}$, $z_{n+1}$), ($x_{n+1,3}$, $y_{n+1,3}$, $z_{n+1}$), ($x_{n+1,4}$, $y_{n+1,4}$, $z_{n+1}$), ($x_{n+1,5}$, $y_{n+1,5}$, $z_{n+1}$), ($x_{n+1,6}$, $y_{n+1,6}$, $z_{n+1}$), ($x_{n+1,7}$, $y_{n+1,7}$, $z_{n+1}$), ($x_{n+1,8}$, $y_{n+1,8}$, $z_{n+1}$), wherein the coordinates ($x_{i,j}$, $y_{i,j}$, $z_i$) for the $kh_1$ value ($kh_1 = 2\pi (t_1/\lambda)$) of 0.6 are as listed in Table 1, the coordinates ($x_{i,j}$, $y_{i,j}$, $z_i$) for the $kh_1$ value of 0.8 are listed in Table 2, the coordinates ($x_{i,j}$, $y_{i,j}$, $z_i$) for the $kh_1$ value of 1.0 are listed in Table 3, and the coordinates ($x_{i,j}$, $y_{i,j}$, $z_i$) for the $kh_1$ value of 1.4 are listed in Table 4, and wherein the coordinates ($x_{i,j}$, $y_{i,j}$, $z_i$) for the $kh_1$ value $\alpha$ a that is larger than 0.6 and smaller than 1.4 and is not 0.8 and 1.0, are expressed by the following equations:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

where the value $kh_1 = a$ has the coordinates of the vertexes of ($x_{m,j}$, $Y_{m,j}$, $z_m$) and the other value $kh_1 = b$ has the coordinates of the vertexes of ($x_{n,j}$, $Y_{n,j}$, $z_n$) and the values of m, n, and l for the individual ranges of $kh_1$ are listed in Table 5,

TABLE 1

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 1 | 95, 20 | 105, 15 | 105, 10 | 100, 0 | 90, 0 | 80, 0 | 85, 10 | 90, 15 | 60 |
| 2 | 95, 40 | 105, 35 | 105, 20 | 105, 0 |  | 75, 0 | 80, 20 | 85, 35 | 70 |
| 3 | 90, 50 |  |  |  |  |  | 80, 35 |  | 80 |
| 4 |  |  |  |  |  |  | 75, 20 | 75, 35 | 90 |

TABLE 2

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 5 | 95, 25 | 105, 15 | 105, 5 | 105, 0 | 90, 0 | 75, 0 | 80, 10 | 85, 20 | 50 |
| 6 | 95, 40 | 110, 30 | 110, 15 | 110, 0 |  | 70, 0 | 70, 15 | 80, 35 | 60 |
| 7 | 100, 50 | 110, 35 | 110, 20 |  |  |  | 70, 20 |  | 70 |
| 8 | 100, 55 | 110, 40 |  |  |  |  | 75, 20 | 85, 40 | 80 |

TABLE 3

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 9 | 95, 35 | 105, 25 | 105, 10 | 105, 0 | 90, 0 | 75, 0 | 80, 10 | 85, 15 | 40 |
| 10 | 100, 30 | 110, 20 | 110, 10 | 110, 0 |  | 70, 0 | 75, 15 | 85, 25 | 50 |
| 11 | 100, 40 | 110, 30 | 115, 25 |  |  | 65, 0 | 70, 20 | 80, 35 | 60 |
| 12 | 105, 45 | 115, 30 | 115, 20 |  |  |  | 75, 0 | 85, 0 | 70 |
| 13 | 100, 55 | 115, 40 |  | 115, 0 | 95, 0 | 70, 0 | 75, 15 | 85, 30 | 80 |
| 14 | 90, 30 | 100, 15 | 100, 10 | 105, 0 | 90, 0 | 75, 0 | 80, 10 | 80, 20 | 90 |

TABLE 4

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 15 | 90, 15 | 100, 10 | 105, 5 | 105, 0 | 90, 0 | 75, 0 | 80, 5 | 85, 10 | 20 |
| 16 | 100, 20 | 115, 15 | 115, 10 | 115, 0 |  | 70, 0 | 75, 0 | 80, 15 | 30 |
| 17 | 100, 25 | 110, 20 |  | 110, 0 |  | 65, 0 | 70, 10 | 80, 20 | 40 |
| 18 | 105, 35 | 120, 30 | 120, 15 | 115, 0 |  |  | 70, 15 | 85, 30 | 50 |
| 19 | 110, 35 | 115, 30 |  |  |  |  |  |  | 60 |
| 20 | 105, 30 | 110, 25 | 110, 10 | 110, 0 |  | 70, 0 | 75, 10 |  | 70 |

TABLE 5

| $kh_1$ | m | n | l |
|---|---|---|---|
| $0.6 < kh_1 < 0.8$ | 1 | 6 | 201 |
|  | 2 | 7 | 202 |
|  | 3 | 8 | 203 |
| $0.8 < kh_1 < 1.0$ | 5 | 10 | 204 |

TABLE 5-continued

| $kh_1$ | m | n | l |
|---|---|---|---|
|  | 6 | 11 | 205 |
|  | 7 | 12 | 206 |
|  | 8 | 13 | 207 |
| $1.0 < kh_1 < 1.4$ | 9 | 17 | 208 |
|  | 10 | 18 | 209 |
|  | 11 | 19 | 210 |
|  | 12 | 20 | 211. |

2. A SAW device that utilizes a SAW of the 0th-order mode comprising a diamond substrate, a $KNbO_3$ layer formed on the diamond substrate, and IDTs, wherein:

(a) the IDTs are formed on the $KNbO_3$ layer; and (b) the $KNbO_3$ layer is composed of a single crystal having a layer thickness $t_1$ and a crystal orientation ($\theta$, $\psi$, $\phi$) as defined in the following Tables and equations: a coordinate (x, y, z) which represents the crystal orientation ($\theta$, $\psi$, $\phi$) within a realm $V_n$ of an octagonal prism having opposite octagonal planes, one of which has eight vertexes represented by ($x_{n,1}$, $y_{n,1}$, $z_n$), ($x_{n,2}$, $y_{n,2}$, $z_n$), ($x_{n,3}$, $y_{n,3}$, $z_n$), ($x_{n,4}$, $y_{n,4}$, $z_n$), ($x_{n,5}$, $y_{n,5}$, $z_n$), ($x_{n,6}$, $y_{n,6}$, $z_n$), ($x_{n,7}$, $y_{n,7}$, $z_n$), ($x_{n,8}$, $y_{n,8}$, $z_n$), and the other of which has eight vertexes represented by ($x_{n+1,1}$, $y_{n+1,1}$, $z_{n+1}$), ($x_{n+1,2}$, $y_{n+1,2}$, $z_{n+1}$), ($x_{n+1,3}$, $y_{n+1,3}$, $z_{n+1}$), ($x_{n+1,4}$, $y_{n+1,4}$, $z_{n+1}$), ($x_{n+1,5}$, $y_{n+1,5}$, $z_{n+1}$), ($x_{n+1,6}$, $y_{n+1,6}$, $z_{n+1}$), ($x_{n+1,7}$, $y_{n+1,7}$, $z_{n+1}$), ($x_{n+1,8}$, $y_{n+1,8}$, $z_{n+1}$) wherein the coordinates ($x_{i,j}$, $y_{i,j}$, $z_i$) for the $kh_1$ value ($kh_1 = 2\pi (t_1/\lambda)$) of 0.8 are listed in Table 6, the coordinates ($x_{i,j}$, $y_{i,j}$, $z_i$) for the $kh_1$ value of 1.0 are listed in Table 7 and the coordinates ($x_{i,j}$, $y_{i,j}$, $z_i$) for the $kh_1$ value of 1.4 are listed in Table 8, and wherein the coordinates ($x_{i,j}$, $y_{i,j}$, $z_i$) for the $kh_1$ value $\alpha$ that is larger than 0.8 and smaller than 1.4 and is not 1.0, are expressed by the following equations:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

where the value $kh_1 = a$ has the coordinates of the vertexes of ($x_{m,j}$, $y_{m,j}$, $z_m$) and the other value $kh_1 = b$ has the coordinates of the vertexes of ($x_{n,j}$, $y_{n,j}$, $z_n$), and the values of m, n, and l for the individual ranges of $kh_1$ are listed in Table 9,

TABLE 6

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 21 | 110, 20 | 125, 20 | 125, 10 | 120, 0 | 105, 0 | 60, 0 | 80, 5 | 95, 15 | 30 |
| 22 | 115, 30 | 125, 25 |  |  | 95, 0 |  | 70, 10 | 90, 25 | 40 |
| 23 | 110, 35 | 125, 30 | 125, 15 |  |  |  | 75, 20 | 90, 30 | 50 |
| 24 |  | 130, 30 | 125, 10 | 125, 0 | 90, 0 | 65, 0 | 70, 15 | 85, 35 | 60 |
| 25 | 105, 35 | 115, 30 | 115, 15 | 110, 0 |  | 70, 0 | 75, 15 | 85, 30 | 70 |
| 26 | 95, 25 | 105, 15 | 105, 10 | 105, 0 |  | 75, 0 | 80, 10 | 85, 25 | 80 |
| 27 | 90, 20 | 95, 10 | 98, 5 | 100, 0 |  | 80, 0 | 82, 5 | 85, 10 | 90 |

TABLE 7

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 28 | 90, 20 | 115, 15 | 130, 10 | 140, 0 | 90, 0 | 40, 0 | 50, 10 | 70, 20 | 0 |
| 29 | 95, 25 | 125, 25 | 135, 15 |  |  |  | 55, 10 | 75, 20 | 10 |
| 30 | 105, 30 | 130, 25 | 140, 15 | 130, 0 | 95, 0 | 45, 0 | 65, 15 | 85, 20 | 20 |
| 31 | 100, 30 | 130, 30 | 140, 20 |  | 100, 0 | 50, 0 |  | 90, 30 | 30 |
| 32 |  |  |  |  |  |  |  |  | 40 |
| 33 | 120, 40 |  | 135, 20 | 125, 0 | 95, 0 | 55, 0 | 70, 20 | 85, 30 | 50 |
| 34 | 110, 40 | 125, 35 | 125, 20 | 120, 0 | 90, 0 | 60, 0 |  | 90, 30 | 60 |
| 35 |  | 120, 30 | 120, 15 | 115, 0 |  | 65, 0 | 70, 15 | 85, 30 | 70 |
| 36 | 95, 25 | 105, 20 | 105, 10 | 105, 0 |  | 75, 0 | 80, 10 | 85, 15 | 80 |
| 37 | 90, 15 | 95, 10 | 98, 5 | 100, 0 |  | 80, 0 | 82, 5 | 85, 10 | 90 |

TABLE 8

| i | $x_{i,1}$, $y_{i,1}$ | $x_{i,2}$, $y_{i,2}$ | $x_{i,3}$, $y_{i,3}$ | $x_{i,4}$, $y_{i,4}$ | $x_{i,5}$, $y_{i,5}$ | $x_{i,6}$, $y_{i,6}$ | $x_{i,7}$, $y_{i,7}$ | $x_{i,8}$, $y_{i,8}$ | $z_i$ |
|---|---|---|---|---|---|---|---|---|---|
| 38 | 90, 30 | 15, 25 | 140, 20 | 150, 0 | 90, 0 | 25, 0 | 45, 20 | 65, 25 | 0 |
| 39 | 100, 30 | 130, 30 | 150, 15 |  | 95, 0 | 30, 0 | 50, 15 | 75, 25 | 10 |
| 40 | 110, 30 | 135, 30 | 150, 20 | 140, 0 | 90, 0 | 40, 0 | 55, 10 | 80, 30 | 20 |
| 41 | 115, 35 | 140, 30 | 145, 20 | 135, 0 | 100, 0 | 45, 0 |  | 80, 25 | 30 |
| 42 | 120, 40 | 135, 35 | 140, 20 | 130, 0 |  | 50, 0 | 65, 15 | 80, 30 | 40 |
| 43 | 120, 45 | 135, 40 | 135, 20 | 125, 0 |  |  |  | 90, 30 | 50 |
| 44 | 115, 40 | 130, 35 | 130, 20 | 120, 0 | 90, 0 | 60, 0 | 70, 20 | 90, 35 | 60 |
| 45 | 110, 35 | 120, 30 | 115, 10 | 110, 0 |  | 70, 0 | 75, 15 | 90, 30 | 70 |
| 46 | 100, 15 | 110, 10 | 110, 10 |  |  | 80, 0 | 85, 5 | 90, 10 | 80 |

TABLE 9

| kh$_1$ | m | n | l |
|---|---|---|---|
| 0.8 < kh$_1$ < 1.0 | 21 | 31 | 212 |
| | 22 | 32 | 213 |
| | 23 | 33 | 214 |
| | 24 | 34 | 215 |
| | 25 | 35 | 216 |
| | 26 | 36 | 217 |
| | 27 | 37 | 218 |
| 1.0 < kh$_1$ < 1.4 | 28 | 38 | 219 |
| | 29 | 39 | 220 |
| | 30 | 40 | 221 |
| | 31 | 41 | 222 |
| | 32 | 42 | 223 |
| | 33 | 43 | 224 |
| | 34 | 44 | 225 |
| | 35 | 45 | 226 |
| | 36 | 46 | 227. |

3. A SAW device that utilizes a SAW if the 0th-order mode comprising a diamond substrate, a KNbO$_3$ layer formed on the diamond substrate, and IDTs, wherein:

(a) the IDTs are formed on the diamond substrate; and (b) the KNbO$_3$ layer is composed of a single crystal having a layer thickness t$_1$ and a crystal orientation (θ, ψ, φ) as defined in the following Tables and equations:

a coordinate (x, y, z) which represent the crystal orientation (θ, ψ, φ) within a realm V$_n$ of an octagonal prism having opposite octagonal planes, one of which has eight vertexes represented by (x$_{n, 1}$, y$_{n, 1}$, z$_n$), (x$_{n, 2}$, y$_{n, 2}$, z$_n$), (x$_{n, 3}$, y$_{n, 3}$, z$_n$), (x$_{n, 4}$, y$_{n, 4}$, z$_n$), (x$_{n, 5}$, y$_{n, 5}$, z$_n$), (x$_{n, 6}$, y$_{n, 6}$, z$_n$), (x$_{n, 7}$, y$_{n, 7}$, z$_n$), (x$_{n, 8}$, y$_{n, 8}$, z$_n$), and the other of which has eight vertexes represented by (x$_{n+1, 1}$, y$_{n+1, 1}$, z$_{n+1}$), (x$_{n+1, 2}$, y$_{n+1, 2}$, z$_{n+1}$), (x$_{n+1, 3}$, y$_{n+1, 3}$, z$_{n+1}$), (x$_{n+1, 4}$, y$_{n+1, 4}$, z$_{n+1}$), (x$_{n+1, 5}$, y$_{n+1, 5}$, z$_{n+1}$), (x$_{n+1, 6}$, y$_{n+1, 6}$, z$_{n+1}$), (x$_{n+1, 7}$, y$_{n+1, 7}$, z$_{n+1}$), (x$_{n+1, 8}$, y$_{n+1, 8}$, z$_{n+1}$), wherein the coordinates (x$_{i, j}$, y$_{i, j}$, z$_i$) for the kh$_1$ value (kh$_1$=2π(t$_1$/λ)) of 1.0 are listed in Table 10, and the coordinates (x$_{i, j}$, y$_{i, j}$, z$_i$) for the kh$_1$ value of 1.4 are listed in Table 11, and wherein the coordinates (x$_{i, j}$, y$_{i, j}$, z$_i$) for the kh$_1$ value a that is larger than 1.0 and smaller 1.4, are expressed by the following equations:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

where the value kh$_1$=a has the coordinates of the vertexes of (x$_{m, j}$, y$_{m, j}$, z$_m$) and the other value b has the coordinates of the vertexes of (x$_{n, j}$, y$_{n, j}$, z$_n$) and the values of m, n, and l for the individual ranges of kh$_1$ are listed in Table 12,

TABLE 10

| i | x$_{i,1}$, y$_{i,1}$ | x$_{i,2}$, y$_{i,2}$ | x$_{i,3}$, y$_{i,3}$ | x$_{i,4}$, y$_{i,4}$ | x$_{i,5}$, y$_{i,5}$ | x$_{i,6}$, y$_{i,6}$ | x$_{i,7}$, y$_{i,7}$ | x$_{i,8}$, y$_{i,8}$ | z$_i$ |
|---|---|---|---|---|---|---|---|---|---|
| 47 | 90, 5 | 105, 5 | 120, 5 | 130, 0 | 90, 0 | 50, 0 | 60, 5 | 75, 5 | 0 |
| 48 | 105, 10 | 125, 10 | 125, 5 | 120, 0 | | 60, 0 | 75, 5 | 90, 5 | 10 |
| 49 | 110, 15 | 125, 15 | 125, 10 | 115, 0 | 95, 0 | 65, 0 | 80, 10 | 90, 10 | 20 |
| 50 | 110, 20 | | 120, 10 | 110, 0 | | | 85, 10 | 95, 15 | 30 |
| 51 | 115, 25 | 125, 20 | | | | 70, 0 | | 95, 20 | 40 |
| 52 | 110, 30 | 120, 20 | 110, 10 | 105, 0 | 90, 0 | | | 100, 30 | 50 |
| 53 | 100, 25 | 105, 20 | 102, 10 | 100, 5 | 95, 5 | 85, 5 | 90, 10 | 95, 15 | 60 |

TABLE 11

| i | x$_{i,1}$, y$_{i,1}$ | x$_{i,2}$, y$_{i,2}$ | x$_{i,3}$, y$_{i,3}$ | x$_{i,4}$, y$_{i,4}$ | x$_{i,5}$, y$_{i,5}$ | x$_{i,6}$, y$_{i,6}$ | x$_{i,7}$, y$_{i,7}$ | x$_{i,8}$, y$_{i,8}$ | z$_i$ |
|---|---|---|---|---|---|---|---|---|---|
| 54 | 90, 15 | 110, 15 | 130, 10 | 145, 0 | 90, 0 | 30, 0 | 45, 10 | 70, 15 | 0 |
| 55 | 100, 20 | 125, 20 | 140, 15 | 140, 0 | 100, 0 | 40, 0 | 60, 10 | 80, 15 | 10 |
| 56 | 110, 25 | 130, 25 | | 130, 0 | | 50, 0 | 65, 10 | 85, 20 | 20 |
| 57 | 120, 25 | 135, 25 | 135, 10 | 125, 0 | 90, 0 | 60, 0 | 75, 10 | 95, 20 | 30 |
| 58 | 120, 30 | | 130, 10 | 115, 0 | 95, 0 | 65, 0 | 85, 25 | 100, 30 | 40 |
| 59 | | 125, 20 | 115, 10 | 110, 0 | | 70, 0 | 85, 15 | 100, 20 | 50 |

TABLE 12

| kh$_1$ | m | n | l |
|---|---|---|---|
| 1.0 < kh$_1$ < 1.4 | 47 | 54 | 228 |
| | 48 | 55 | 229 |
| | 49 | 56 | 230 |
| | 50 | 57 | 231 |
| | 51 | 58 | 232 |
| | 52 | 59 | 233. |

4. A SAW device that utilizes a SAW of the 1st-order mode comprising a diamond substrate, a KNbO$_3$ layer formed on the diamond substrate, and IDTs, wherein:

(a) the IDTs are formed on the KNbO$_3$ layer;

(b) a short-circuiting electrode is provided between the KNbO$_3$ layer and the diamond substrate; and (c) the KNbO$_3$ layer is composed of a single crystal having a layer thickness t$_1$, and a crystal orientation (θ, ψ, φ) as defined in the following Table:

a coordinate (x, y, z) which represents the crystal orientation (θ, ψ, φ) within a realm V$_n$ of an octagonal prism having opposite octagonal planes, one of which has eight vertexes represented by (x$_{n, 1}$, y$_{n, 1}$, z$_n$), (x$_{n, 2}$, y$_{n, 2}$, z$_n$), (x$_{n, 3}$, y$_{n, 3}$, z$_n$), (x$_{n, 4}$, y$_{n, 4}$, z$_n$), (x$_{n, 5}$, y$_{n, 5}$, z$_n$), (x$_{n, 6}$, y$_{n, 6}$, z$_n$), (x$_{n, 7}$, y$_{n, 7}$, z$_n$), (x$_{n, 8}$, y$_{n, 8}$, z$_n$), and the other of which has eight vertexes represented by (x$_{n+1, 1}$, y$_{n+1, 1}$, z$_{n+1}$), (x$_{n+1, 2}$, y$_{n+1, 2}$, z$_{n+1}$), (x$_{n+1, 3}$, y$_{n+1, 3}$, z$_{n+1}$), (x$_{n+1, 4}$, y$_{n+1, 4}$, z$_{n+1}$), (x$_{n+1, 5}$, y$_{n+1, 5}$, z$_{n+1}$), (x$_{n+1, 6}$, y$_{n+1, 6}$, z$_{n+1}$), (x$_{n+1, 7}$, y$_{n+1, 7}$, z$_{n+1}$), (x$_{n+1, 8}$, y$_{n+1, 8}$, z$_{n+1}$), wherein the coordinates (x$_{i, j}$, y$_{i, j}$, z$_i$) for the kh$_1$ value (kh$_1$=2π(t$_1$/λ)) of 0.4 are listed in Table 13,

TABLE 13

| i | x$_{i,1}$, y$_{i,1}$ | x$_{i,2}$, y$_{i,2}$ | x$_{i,3}$, y$_{i,3}$ | x$_{i,4}$, y$_{i,4}$ | x$_{i,5}$, y$_{i,5}$ | x$_{i,6}$, y$_{i,6}$ | x$_{i,7}$, y$_{i,7}$ | x$_{i,8}$, y$_{i,8}$ | z$_i$ |
|---|---|---|---|---|---|---|---|---|---|
| 60 | 90, 18 | 93, 15 | 95, 10 | 97, 5 | 90, 5 | 83, 5 | 85, 10 | 87, 15 | 70 |
| 61 | 90, 30 | 100, 25 | 100, 10 | 100, 0 | 90, 0 | 75, 0 | 75, 10 | 80, 25 | 80 |
| 62 | 90, 40 | 100, 30 | 100, 15 | 105, 0 | | | 75, 15 | | 90. |

5. A SAW device that utilizes a SAW of the 1st-order mode comprising a diamond substrate, a KNbO$_3$ layer formed on the diamond substrate, and IDTs, wherein:

(a) the IDTs are formed on the KNbO$_3$ layer; and (b) the KNbO$_3$ layer is composed of a single crystal having a layer thickness t$_1$ and a crystal orientation (θ, ψ, φ) as defined in the following Tables and equations:

a coordinate (x, y, z) which represents the crystal orientation (θ, ψ, φ) within a realm V$_n$ of an octagonal prism having opposite octagonal planes, one of which has eight vertexes represented by (x$_{n, 1}$, y$_{n, 1}$, z$_n$), (x$_{n, 2}$, y$_{n, 2}$, z$_n$), (x$_{n, 3}$, y$_{n, 3}$, z$_n$), (x$_{n, 4}$, y$_{n, 4}$, z$_n$), (x$_{n, 5}$, y$_{n, 5}$, z$_n$), (x$_{n, 6}$, y$_{n, 6}$, z$_n$), (x$_{n, 7}$, y$_{n, 7}$, z$_n$), (x$_{n, 8}$, y$_{n, 8}$, z$_n$), and the other of which has eight vertexes represented by (x$_{n+1, 1}$, y$_{n+1, 1}$, z$_{n+1}$), (x$_{n+1, 2}$, y$_{n+1, 2}$, z$_{n+1}$), (x$_{n+1, 3}$, y$_{n+1, 3}$, z$_{n+1}$), (x$_{n+1, 4}$, y$_{n+1, 4}$, z$_{n+1}$), (x$_{n+1, 5}$, y$_{n+1, 5}$, z$_{n+1}$), (x$_{n+1, 6}$, y$_{n+1, 6}$, z$_{n+1}$), (x$_{n+1, 7}$, y$_{n+1, 7}$, z$_{n+1}$), (x$_{n+1, 8}$, y$_{n+1, 8}$, z$_{n+1}$) wherein the coordinates (x$_{i, j}$, y$_{i, j}$, z$_i$) for the kh$_1$ value (kh$_1$=2π(t$_1$/λ)) of 1.0 are listed in Table 14, the coordinates (x$_{i, j}$, y$_{i, j}$, z$_i$) for the kh$_1$ value of 1.2 are listed in Table 15, and wherein the coordinates (x$_{i, j}$, y$_{i, j}$, z$_i$) for the kh$_1$ value a that is larger than 1.0 and smaller than 1.2, are expressed by the following equations:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

where the value kh$_1$=a has the coordinates of the vertexes of (x$_{m, j}$, y$_{m, j}$, z$_m$) and the other value kh$_1$=b has the coordinates of the vertexes of (x$_{n, j}$, y$_{n, j}$, z$_n$), and the values of m, n, and 1 for the individual ranges of kh1 are listed in Table 16,

TABLE 14

| i | x$_{i,1}$, y$_{i,1}$ | x$_{i,2}$, y$_{i,2}$ | x$_{i,3}$, y$_{i,3}$ | x$_{i,4}$, y$_{i,4}$ | x$_{i,5}$, y$_{i,5}$ | x$_{i,6}$, y$_{i,6}$ | x$_{i,7}$, y$_{i,7}$ | x$_{i,8}$, y$_{i,8}$ | z$_i$ |
|---|---|---|---|---|---|---|---|---|---|
| 63 | 120, 55 | 125, 50 | 125, 50 | 120, 50 | 115, 50 | 110, 50 | 110, 55 | 115, 55 | 10 |
| 64 | 120, 60 | 130, 55 | 135, 50 | 130, 50 | 120, 50 | | | 115, 60 | 20 |
| 65 | 125, 65 | 140, 60 | 145, 50 | | | 105, 55 | 60, 60 | 105, 65 | 30 |
| 66 | 120, 70 | 135, 70 | 145, 60 | 135, 55 | 125, 55 | 110, 55 | 100, 60 | | 40 |
| 67 | 125, 75 | 140, 70 | 150, 60 | 140, 55 | | 115, 55 | | 110, 70 | 50 |
| 68 | 130, 75 | | 150, 70 | 140, 65 | 130, 60 | 120, 60 | 105, 70 | 115, 75 | 60 |

TABLE 15

| i | x$_{i,1}$, y$_{i,1}$ | x$_{i,2}$, y$_{i,2}$ | x$_{i,3}$, y$_{i,3}$ | x$_{i,4}$, y$_{i,4}$ | x$_{i,5}$, y$_{i,5}$ | x$_{i,6}$, y$_{i,6}$ | x$_{i,7}$, y$_{i,7}$ | x$_{i,8}$, y$_{i,8}$ | z$_i$ |
|---|---|---|---|---|---|---|---|---|---|
| 69 | 90, 65 | 110, 60 | 120, 50 | 110, 45 | 95, 45 | 80, 45 | 60, 45 | 70, 60 | 0 |
| 70 | 110, 60 | 115, 65 | 130, 50 | 115, 45 | 100, 45 | | 70, 50 | 80, 65 | 10 |
| 71 | 105, 70 | 120, 65 | 135, 55 | 125, 50 | 110, 50 | 95, 50 | 80, 50 | 85, 60 | 20 |
| 72 | 120, 75 | 130, 65 | 140, 50 | 130, 45 | 120, 45 | 100, 45 | 85, 55 | 100, 70 | 30 |
| 73 | | 135, 70 | 145, 60 | 140, 53 | 125, 50 | 115, 50 | 100, 55 | | 40 |
| 74 | 125, 75 | | 145, 65 | 135, 55 | 125, 55 | 110, 55 | 105, 65 | 110, 75 | 50 |
| 75 | 130, 80 | 140, 75 | 145, 70 | 140, 70 | 130, 65 | 120, 65 | 110, 70 | 120, 80 | 60 |

TABLE 16

| kh₁ | m | n | l |
|---|---|---|---|
| 1.0 < kh₁ < 1.2 | 63 | 70 | 234 |
|  | 64 | 71 | 235 |
|  | 65 | 72 | 236 |
|  | 66 | 73 | 237 |
|  | 67 | 74 | 238 |
|  | 68 | 75 | 239. |

6. A SAW device that utilizes a SAW of the 1st-order mode comprising a diamond substrate, a $KNbO_3$ layer formed on the diamond substrate, and IDTs, wherein:
   (a) the IDTs are formed on the diamond substrate; and
   (b) the $KNbO_3$ layer is composed of a single crystal having a layer thickness $t_1$ and a crystal orientation ($\theta$, $\psi$, $\phi$) as defined in the following Table:
   a coordinate (x, y, z) which represents the crystal orientation ($\theta$, $\psi$, $\phi$) within a realm $V_n$ of an octagonal prism having opposite octagonal planes, one of which has eight vertexes represented by $(x_{n,1}, y_{n,1}, z_n)$, $(x_{n,2}, y_{n,2}, z_n)$, $(x_{n,3}, y_{n,3}, z_n)$, $(x_{n,4}, y_{n,4}, z_n)$, $(x_{n,5}, y_{n,5}, z_n)$, $(x_{n,6}, y_{n,6}, z_n)$, $(x_{n,7}, y_{n,7}, z_n)$, $(x_{n,8}, y_{n,8}, z_n)$ and the other of which has eight vertexes represented by $(x_{n+1,1}, y_{n+1,1}, z_{n+1})$, $(x_{n+1,2}, y_{n+1,2}, z_{n+1})$, $(x_{n+1,3}, y_{n+1,3}, z_{n+1})$, $(x_{n+1,4}, y_{n+1,4}, z_{n+1})$, $(x_{n+1,5}, y_{n+1,5}, z_{n+1})$, $(x_{n+1,5}, y_{n+1,5}, z_{n+1})$, $(x_{n+1,6}, y_{n+1,6}, z_{n+1})$, $(x_{n+1,7}, y_{n+1,7}, z_{n+1})$, $(x_{n+1,8}, y_{n+1,8}, z_{n+1})$, wherein the coordinates $(x_{i,j}, y_{i,j}, z_i)$ for the $kh_1$ value ($kh_1=2\pi(t_1/\lambda)$) of 1.2 are in Table 17,

TABLE 17

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 76 | 95, 55 | 105, 55 | 110, 50 | 105, 45 | 95, 45 | 80, 45 | 70, 50 | 80, 55 | 0 |
| 77 | 100, 55 | 110, 55 | 120, 50 | 110, 45 | 100, 45 | 90, 45 | 80, 50 | 90, 55 | 10 |
| 78 | 110, 55 | 115, 55 |  | 115, 45 | 110, 45 | 100, 45 | 85, 50 | 95, 55 | 20 |
| 79 | 115, 60 | 125, 60 | 125, 55 | 120, 50 | 115, 50 | 105, 50 | 100, 60 | 105, 60 | 30 |
| 80 | 125, 65 | 130, 65 | 135, 60 | 130, 55 | 125, 55 | 115, 55 | 110, 60 | 115, 65 | 40. |

7. A SAW device that utilizes a SAW of the 2nd-order mode comprising a diamond substrate, a $KNbO_3$ layer formed on the diamond substrate, and IDTs, wherein:
   (a) the IDTs are formed on the $KNbO_3$ layer;
   (b) a short-circuiting electrode is provided between the $KNbO_3$ layer and the diamond substrate; and
   (c) the $KNbO_3$ layer is composed of a single crystal having a layer thickness $t_1$ and a crystal orientation ($\theta$, $\psi$, $\phi$) as defined in the following Tables and equations:
   a coordinate (x, y, z) which represents the crystal orientation ($\theta$, $\psi$, $\phi$) within a realm $V_n$ of an octagonal prism having opposite octagonal planes, one of which has eight vertexes represented by $(x_{n,1}, y_{n,1}, z_n)$, $(x_{n,2}, y_{n,2}, z_n)$, $(x_{n,3}, y_{n,3}, z_n)$, $(x_{n,4}, y_{n,4}, z_n)$, $(x_{n,5}, y_{n,5}, z_n)$, $(x_{n,6}, y_{n,6}, z_n)$, $(x_{n,7}, y_{n,7}, z_n)$, $(x_{n,8}, y_{n,8}, z_n)$ and the other of which has eight vertexes represented by $(x_{n+1,1}, y_{n+1,1}, z_{n+1})$, $(x_{n+1,2}, y_{n+1,2}, z_{n+1})$, $(x_{n+1,3}, y_{n+1,3}, z_{n+1})$, $(x_{n+1,4}, y_{n+1,4}, z_{n+1})$, $(x_{n+1,5}, y_{n+1,5}, z_{n+1})$, $(x_{n+1,6}, y_{n+1,6}, z_{n+1})$, $(x_{n+1,7}, y_{n+1,7}, z_{n+1})$, $(x_{n+1,8}, y_{n+1,8}, z_{n+1})$ wherein the coordinates $(x_{i,j}, y_{i,j}, z_i)$ for the $kh_1$ value ($kh_1=2\pi(t_1/\lambda)$) of 1.2 are listed in Table 18, the coordinates $(x_{i,j}, y_{i,j}, z_i)$ for the $kh_1$ value of 1.4 are listed in Table 19, the coordinates $(x_{i,j}, y_{i,j}, z_i)$ for the $kh_1$ value of 1.8 are listed in Table 20, and the coordinates $(x_{i,j}, y_{i,j}, z_i)$ for the $kh_1$ value of 2.4 are listed in Table 21, and the coordinates $(x_{i,j}, y_{i,j}, z_i)$ for the $kh_1$ value of 3.0 are listed in Table 22, and wherein the coordinates $(x_{i,j}, y_{i,j}, z_i)$ for the $kh_1$ value $\alpha$ that is larger than 1.2 and smaller than 3.0 and is not 1.4, 1.8, or 2.4, are expressed by the following equations:

$$x_{1,j}(\alpha) = \frac{(x_{n,j} - x_{m,j})\alpha + (bx_{m,j} - ax_{n,j})}{b - a} \quad (1)$$

$$y_{1,j}(\alpha) = \frac{(y_{n,j} - y_{m,j})\alpha + (by_{m,j} - ay_{n,j})}{b - a}$$

-continued $$z_1(\alpha) = \frac{(z_n - z_m)\alpha + (bz_m - az_n)}{b - a}$$

where the value $kh_1=a$ has the coordinates of the vertexes of $(x_{m,j}, y_{m,j}, z_m)$ and the other value $kh_1=b$ has the coordinates of the vertexes of $(x_{n,j}, y_{n,j}, z_n)$, and the values of m, n, and l for the individual ranges of kh1 are listed in Table 23,

TABLE 18

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 81 | 120, 90 | 130, 85 | 140, 80 | 135, 70 | 130, 70 | 115, 70 | 110, 75 | 110, 90 | 70 |
| 82 | 120, 105 | 140, 95 | 155, 80 | 140, 65 | 120, 60 | 100, 65 | 90, 80 | 110, 95 | 80 |
| 83 | 120, 115 | 140, 110 | 150, 90 | 135, 70 | 115, 70 | 90, 70 | 90, 90 | 90, 115 | 90 |

TABLE 19

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 84 | 120, 95 | 140, 90 | 150, 70 | 135, 60 | 120, 55 | 105, 60 | 100, 75 | 95, 95 | 70 |
| 85 | 120, 100 |  | 150, 80 | 135, 70 | 120, 65 | 100, 70 | 90, 90 | 100, 100 | 80 |
| 86 | 120, 110 | 145, 105 | 150, 90 | 135, 75 | 120, 70 | 90, 70 |  | 90, 110 | 90 |

TABLE 20

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 87 | 130, 75 | 145, 75 | 155, 65 | 145, 60 | 135, 55 | 115, 50 | 105, 65 | 115, 85 | 60 |
| 88 | 130, 90 | 150, 85 | 160, 70 |  | 125, 55 | 110, 55 | 100, 65 | 110, 85 | 70 |
| 89 | 130, 95 | 150, 90 | 150, 70 | 135, 60 | 100, 60 | 95, 70 | 85, 85 | 105, 95 | 80 |
| 90 | 125, 110 | 145, 105 | 150, 85 | 135, 75 | 110, 90 | 90, 75 | 90, 95 | 105, 105 | 90 |

TABLE 21

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 91 | 130, 70 | 145, 70 | 155, 60 | 150, 50 | 135, 50 | 120, 50 | 110, 60 | 105, 70 | 50 |
| 92 | 130, 80 | 150, 80 | 150, 60 | 140, 70 | 125, 45 | 100, 50 | 100, 65 | 115, 75 | 60 |
| 93 | 135, 90 | 150, 85 | 145, 65 | 140, 60 | 125, 50 | 105, 50 | 100, 70 | 110, 85 | 70 |
| 94 | 130, 95 | 150, 95 | 160, 70 | 145, 65 | 130, 60 | 110, 60 | 100, 75 | 105, 90 | 80 |
| 95 | 130, 90 | 150, 90 | 155, 80 | 145, 75 | 130, 70 | 120, 75 | 105, 80 | 115, 90 | 90 |

TABLE 22

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 96 | 140, 60 | 150, 60 | 150, 50 | 140, 50 | 135, 50 | 130, 50 | 120, 60 | 125, 60 | 40 |
| 97 | 135, 70 | 150, 65 | 155, 55 | 145, 50 | 130, 45 | 110, 45 | 105, 60 | 120, 70 | 50 |
| 98 | 120, 80 | 140, 75 | 155, 70 | 165, 50 | 140, 45 | 120, 35 | 100, 40 | 100, 60 | 60 |
| 99 | 125, 85 | 150, 85 | 160, 70 | 145, 55 | 130, 50 | 110, 40 | 100, 66 | 100, 80 | 70 |
| 100 | 95, 135 | 95, 150 | 75, 165 | 65, 150 | 60, 135 | 60, 115 | 80, 105 | 90, 120 | 80 |
| 101 | 130, 105 | 145, 105 | 155, 90 | 150, 80 | 135, 75 | 115, 75 | 110, 90 | 115, 105 | 90 |

TABLE 23

| $kh_1$ | m | n | l |
|---|---|---|---|
| $1.2 < kh_1 < 1.4$ | 81 | 84 | 240 |
|  | 82 | 85 | 241 |
|  | 83 | 86 | 242 |
| $1.4 < kh_1 < 1.8$ | 84 | 88 | 243 |
|  | 85 | 89 | 244 |
|  | 86 | 90 | 245 |
| $1.8 < kh_1 < 2.4$ | 87 | 92 | 246 |
|  | 88 | 93 | 247 |
|  | 89 | 94 | 248 |
|  | 90 | 95 | 249 |
| $2.4 < kh_1 < 3.0$ | 91 | 97 | 250 |
|  | 92 | 98 | 251 |
|  | 93 | 99 | 252 |
|  | 94 | 100 | 253 |
|  | 95 | 101 | 254. |

8. A SAW of the 2nd-order mode comprising a diamond substrate, a $KNbO_3$ layer formed on the diamond substrate, and IDTs, wherein:

(a) the IDTs are formed on the $KNbO_3$ layer; and (b) the $KNbO_3$ layer is composed of a single crystal having a layer thickness $t_1$ and a crystal orientation ($\theta$, $\psi$, $\phi$) as defined in the following Tables and equations: a coordinate (x, y, z) which represents the crystal orientation ($\theta$, $\psi$, $\phi$) within a realm $V_n$ of an octagonal prism having opposite octagonal planes, one of which has eight vertexes represented by $(x_{n,1}, y_{n,1}, z_n)$, $(x_{n,2}, y_{n,2}, z_n)$, $(x_{n,3}, y_{n,3}, z_n)$, $(x_{n,4}, y_{n,4}, z_n)$, $(x_{n,5}, y_{n,5}, z_n)$, $(x_{n,6}, y_{n,6}, z_n)$, $(x_{n,7}, y_{n,7}, z_n)$, $(x_{n,8}, y_{n,8}, z_n)$ and the other of which has eight vertexes represented by $(x_{n+1,1}, y_{n+1,1}, z_{n+1})$, $(x_{n+1,2}, y_{n+1,2}, z_{n+1})$, $(x_{n+1,3}, y_{n+1,3}, z_{n+1})$, $(x_{n+1,4}, y_{n+1,4}, z_{n+1})$, $(x_{n+1,5}, y_{n+1,5}, z_{n+1})$, $(x_{n+1,6}, y_{n+1,6}, z_{n+1})$, $(x_{n+1,7}, y_{n+1,7}, z_{n+1})$, $(x_{n+1,8}, y_{n+1,8}, z_{n+1})$ wherein the coordinates $(x_{i,j}, y_{i,j}, z_i)$ for $kh_1$ value ($kh_1 = 2\pi(t_1/\lambda)$) of 0.6 are listed in Table 24, the coordinates $(x_{i,j}, y_{i,j}, z_i)$ for the $kh_1$ value of 0.8 are listed in Table 25, the coordinates $(x_{i,j}, y_{i,j}, z_i)$ for the $kh_1$ value of 1.0 are listed in Table 26, the coordinates $(x_{i,j}, y_{i,j}, z_i)$ for the $kh_1$ value of 1.2 are listed in Table 27, the coordinates $(x_{i,j}, y_{i,j}, z_i)$ for the $kh_1$ value of 1.4 are listed in Table 28, the coordinates $(x_{i,j}, y_{i,j}, z_i)$ for the $kh_1$ value of 1.8 are listed in Table 29, the coordinates $(x_{i,j}, y_{i,j}, z_i)$ for the $kh_1$ value of 2.4 are listed in Table 30, and the coordinates $(x_{i,j}, y_{i,j}, z_i)$ for the $kh_1$ value of 3.0 are listed in Table 31, and wherein the coordinates $(x_{i,j}, y_{i,j}, z_i)$ for the $kh_1$ value $\alpha$ that is larger than 0.6 and smaller than 3.0 and is not 0.8, 1.0, 1.2, 1.4, 1.8, or 2.4, are expressed by the following equations:

$$x_{1,j}(\alpha) = \frac{(x_{n,j} - x_{m,j})\alpha + (bx_{m,j} - ax_{n,j})}{b - a} \quad (1)$$

-continued $$y_{1,j}(\alpha) = \frac{(y_{n,j} - y_{m,j})\alpha + (by_{m,j} - ay_{n,j})}{b - a}$$

$$z_1(\alpha) = \frac{(z_n - z_m)\alpha + (bz_m - az_n)}{b - a}$$

where the value $kh_1=a$ has the coordinates of the vertexes of $(x_{m,j}, y_{m,j}, z_m)$ and the other value $kh_1=b$ has the coordinates of the vertexes of $(x_{n,j}, y_{n,j}, z_n)$, and the values of m, n, and l for the individual ranges of kh1 are listed in Table 32,

TABLE 24

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 102 | 165, 10 | 170, 10 | 170, 5 | 170, 5 | 165, 5 | 160, 5 | 160, 10 | 160, 15 | 10 |
| 103 | | | | | | | | | 20 |
| 104 | 165, 30 | 170, 20 | 170, 20 | 165, 10 | 160, 10 | 155, 15 | 155, 20 | 160, 25 | 30 |
| 105 | 160, 50 | 170, 45 | 175, 40 | 170, 35 | 160, 30 | 155, 30 | 150, 35 | 155, 40 | 40 |
| 106 | 160, 55 | 170, 55 | 170, 50 | 170, 45 | 165, 45 | 160, 40 | 150, 45 | 155, 55 | 50 |
| 107 | 165, 65 | 170, 65 | 175, 60 | 170, 55 | 165, 50 | 155, 50 | 150, 55 | 155, 60 | 60 |
| 108 | 160, 75 | 170, 75 | 175, 70 | 170, 65 | 165, 60 | 160, 60 | 155, 65 | 155, 70 | 70 |
| 109 | 160, 85 | 170, 85 | 175, 80 | 175, 75 | 165, 70 | 150, 70 | 140, 75 | 150, 80 | 80 |

TABLE 25

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 110 | 155, 55 | 160, 50 | 165, 50 | 160, 50 | 155, 45 | 150, 50 | 150, 55 | 155, 55 | 50 |
| 111 | 155, 65 | 165, 60 | 165, 55 | | 155, 50 | 150, 50 | 145, 55 | 150, 60 | 60 |
| 112 | 160, 70 | 160, 65 | 170, 60 | 165, 60 | 155, 60 | 150, 60 | 150, 65 | 155, 70 | 70 |
| 113 | 150, 85 | 165, 80 | 170, 75 | 165, 75 | 160, 75 | 155, 75 | 150, 80 | 155, 85 | 80 |

TABLE 26

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 114 | 150, 55 | 160, 45 | 165, 40 | 160, 40 | 150, 40 | 145, 45 | 140, 50 | 145, 50 | 50 |
| 115 | 150, 65 | 160, 65 | 165, 65 | 160, 50 | 150, 50 | 140, 50 | 130, 50 | 140, 60 | 60 |
| 116 | 145, 75 | 160, 80 | 165, 70 | 160, 65 | 150, 60 | 140, 55 | 130, 60 | 160, 70 | 70 |
| 117 | 155, 85 | 165, 85 | 170, 75 | 160, 75 | 150, 75 | 145, 75 | 135, 75 | 135, 85 | 80 |

TABLE 27

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 118 | 150, 50 | 160, 40 | 160, 35 | 155, 30 | 150, 30 | 145, 35 | 140, 40 | 145, 45 | 30 |
| 119 | 150, 60 | 160, 35 | 160, 50 | 160, 40 | 150, 35 | 110, 110 | 130, 60 | 140, 65 | 40 |
| 120 | 145, 60 | 160, 65 | 165, 50 | 155, 45 | 140, 46 | 130, 40 | 120, 50 | 130, 60 | 50 |
| 121 | 140, 70 | 160, 75 | 165, 55 | 150, 50 | 135, 40 | 120, 45 | 110, 55 | 130, 70 | 60 |
| 122 | 145, 75 | 160, 85 | 170, 75 | 160, 65 | 150, 50 | 125, 45 | 110, 60 | 115, 75 | 70 |
| 123 | 140, 85 | 160, 90 | 170, 75 | | 150, 60 | 130, 50 | 120, 60 | 125, 80 | 80 |

TABLE 28

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 124 | 140, 45 | 145, 40 | 150, 35 | 150, 35 | 140, 30 | 140, 30 | 135, 35 | 135, 40 | 10 |
| 125 | 145, 50 | 155, 45 | 160, 40 | 155, 25 | 145, 20 | 135, 30 | 130, 35 | 135, 50 | 20 |
| 126 | 145, 60 | 160, 55 | 165, 50 | 160, 35 | 145, 30 | 130, 35 | 120, 45 | 130, 45 | 30 |
| 127 | 140, 60 | 155, 60 | | 145, 40 | 125, 30 | 110, 30 | 100, 40 | 120, 55 | 40 |
| 128 | 130, 70 | 155, 70 | 165, 60 | 150, 45 | 130, 35 | 110, 40 | 90, 50 | 110, 65 | 50 |
| 129 | 125, 80 | 156, 85 | 160, 80 | 150, 50 | 130, 30 | 100, 40 | 90, 55 | 110, 70 | 60 |

TABLE 29

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 130 | 90, 70 | 125, 65 | 140, 40 | 125, 25 | 90, 30 | 60, 25 | 50, 60 | 70, 70 | 0 |
| 131 | 100, 95 | 130, 90 | 150, 45 | 130, 25 | 160, 30 |  | 50, 55 | 70, 90 | 10 |
| 132 | 105, 70 | 135, 65 | 150, 50 | 140, 30 | 130, 30 | 80, 30 | 55, 40 | 70, 70 | 20 |
| 133 | 115, 78 | 140, 70 | 160, 50 | 145, 25 | 120, 30 | 85, 35 | 65, 55 | 90, 75 | 30 |
| 134 | 120, 80 | 150, 70 |  | 145, 40 |  | 90, 35 | 75, 50 | 85, 80 | 40 |
| 135 | 130, 80 | 150, 80 | 160, 60 | 150, 40 | 125, 45 | 100, 50 | 80, 70 | 85, 85 | 50 |
| 136 | 125, 80 | 145, 80 |  | 140, 50 | 120, 45 | 105, 45 | 90, 60 | 100, 80 | 60 |
| 137 | 130, 90 | 160, 70 | 145, 55 | 125, 45 | 100, 50 | 90, 70 | 85, 85 | 110, 90 | 70 |
| 138 | 130, 95 | 155, 95 | 165, 80 | 140, 65 | 120, 60 | 100, 65 |  | 110, 95 | 80 |
| 139 | 125, 110 | 150, 105 | 155, 90 | 140, 75 | 115, 70 | 90, 80 | 90, 100 | 110, 110 | 90 |

TABLE 30

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 140 | 90, 90 | 115, 75 | 135, 55 | 130, 30 | 90, 30 | 50, 30 | 45, 50 | 60, 75 | 0 |
| 141 |  | 115, 80 | 135, 60 |  | 100, 30 | 65, 30 | 50, 50 | 65, 75 | 10 |
| 142 | 190, 90 | 120, 80 | 135, 65 | 140, 30 | 110, 30 | 70, 30 | 55, 50 |  | 20 |
| 143 | 90, 90 | 115, 80 | 140, 65 | 150, 40 | 125, 30 | 100, 50 | 70, 40 | 65, 65 | 30 |
| 144 |  | 130, 80 | 155, 65 |  | 120, 50 | 90, 30 | 70, 50 | 75, 75 | 40 |
| 145 | 125, 80 | 155, 75 | 150, 55 | 130, 40 | 110, 35 | 90, 45 | 85, 65 | 105, 85 | 50 |
| 146 | 110, 90 | 140, 85 | 180, 65 | 140, 45 | 115, 35 |  | 85, 60 | 85, 85 | 60 |
| 147 | 130, 90 | 150, 90 | 160, 70 | 140, 55 | 115, 45 | 95, 55 | 70, 70 | 100, 90 | 70 |
| 148 | 130, 95 | 155, 90 | 150, 70 | 130, 60 | 110, 60 | 95, 75 | 115, 90 | 110, 95 | 80 |
| 149 | 130, 110 | 150, 105 | 155, 90 | 150, 75 | 130, 75 | 110, 75 | 100, 90 | 110, 105 | 90 |

TABLE 31

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 150 | 90, 90 | 110, 70 | 130, 50 | 120, 30 | 90, 30 | 60, 30 | 50, 50 | 70, 70 | 0 |
| 151 |  | 115, 70 | 130, 55 | 130, 30 | 100, 30 | 70, 30 | 60, 50 | 70, 75 | 10 |
| 152 | 90, 80 | 120, 70 | 140, 55 | 125, 30 |  | 75, 30 |  | 75, 70 | 20 |
| 153 | 100, 75 | 125, 70 | 150, 50 | 140, 35 | 115, 35 | 85, 35 | 70, 50 | 80, 70 | 30 |
| 154 | 110, 80 | 135, 70 | 155, 60 | 140, 40 | 120, 35 | 90, 35 | 80, 55 | 90, 75 | 40 |
| 155 | 110, 85 | 125, 75 | 155, 65 | 150, 45 | 125, 35 | 100, 30 | 90, 45 | 90, 65 | 50 |
| 156 | 115, 85 | 145, 75 | 165, 65 | 145, 50 | 125, 40 | 105, 30 | 90, 50 | 90, 70 | 60 |
| 157 | 130, 90 | 155, 85 | 170, 55 | 155, 65 | 130, 50 | 105, 50 | 95, 70 | 105, 85 | 70 |
| 158 | 135, 95 | 145, 90 | 165, 75 | 150, 65 | 130, 60 | 110, 65 | 100, 80 | 110, 90 | 80 |
| 159 | 130, 105 | 150, 100 | 155, 90 | 145, 75 | 130, 75 | 115, 75 | 110, 90 | 115, 105 | 90 |

TABLE 32

| $kh_1$ | m | n | l |
|---|---|---|---|
| $0.6 < kh_1 < 0.8$ | 106 | 110 | 255 |
|  | 107 | 111 | 256 |
|  | 108 | 112 | 257 |
|  | 109 | 113 | 258 |
| $0.8 < kh_1 < 1.0$ | 110 | 114 | 259 |
|  | 111 | 115 | 260 |
|  | 112 | 116 | 261 |
|  | 113 | 117 | 262 |
| $1.0 < kh_1 < 1.2$ | 114 | 120 | 263 |
|  | 115 | 121 | 264 |
|  | 116 | 122 | 265 |
|  | 117 | 123 | 266 |
| $1.2 < kh_1 < 1.4$ | 118 | 126 | 267 |
|  | 119 | 127 | 268 |
|  | 120 | 128 | 269 |
|  | 121 | 129 | 270 |
| $1.4 < kh_1 < 1.8$ | 124 | 131 | 271 |
|  | 125 | 132 | 272 |
|  | 126 | 133 | 273 |
|  | 127 | 134 | 274 |
|  | 128 | 135 | 275 |
|  | 129 | 136 | 276 |
| $1.8 < kh_1 < 2.4$ | 130 | 140 | 277 |
|  | 131 | 141 | 278 |
|  | 132 | 142 | 279 |
|  | 133 | 143 | 280 |
|  | 134 | 144 | 281 |
|  | 135 | 145 | 282 |
|  | 136 | 146 | 283 |
|  | 137 | 147 | 284 |
|  | 138 | 148 | 285 |
|  | 139 | 149 | 286 |
| $2.4 < kh_1 < 3.0$ | 140 | 150 | 287 |
|  | 141 | 151 | 288 |
|  | 142 | 152 | 289 |
|  | 143 | 153 | 290 |
|  | 144 | 154 | 291 |
|  | 145 | 155 | 292 |
|  | 146 | 156 | 293 |
|  | 147 | 157 | 294 |
|  | 148 | 158 | 295 |
|  | 149 | 159 | 296. |

9. A SAW device that utilizes a SAW of the 2nd-order mode comprising a diamond substrate, a KNbO₃ layer formed on the diamond substrate, and IDTs, wherein:

(a) the IDTs are formed on the diamond substrate; and (b) the $KNbO_3$ layer is composed of a single crystal having a layer thickness $t_1$ and a crystal orientation $(\theta, \psi, \phi)$ as defined in the following Tables and equations: a coordinate $(x, y, z)$ which represents the crystal orientation $(\theta, \psi, \phi)$ within a realm $V_n$ of an octagonal prism having opposite octagonal planes, one of which has eight vertexes represented by $(x_{n,1}, y_{n,1}, z_n)$, $(x_{n,2}, y_{n,2}, z_n)$, $(x_{n,3}, y_{n,3}, z_n)$, $(x_{n,4}, y_{n,4}, z_n)$, $(x_{n,5}, y_{n,5}, z_n)$, $(x_{n,6}, y_{n,6}, z_n)$, $(x_{n,7}, y_{n,7}, z_n)$, $(x_{n,8}, y_{n,8}, z_n)$, and the other of which has eight vertexes represented by $(x_{n+1,1}, y_{n+1,1}, z_{n+1})$, $(x_{n+1,2}, y_{n+1,2}, z_{n+1})$, $(x_{n+1,3}, y_{n+1,3}, z_{n+1})$, $(x_{n+1,4}, y_{n+1,4}, z_{n+1})$, $(x_{n+1,5}, y_{n+1,5}, z_{n+1})$, $(x_{n+1,6}, y_{n+1,6}, z_{n+1})$, $(x_{n+1,7}, y_{n+1,7}, z_{n+1})$, $(x_{n+1,8}, y_{n+1,8}, z_{n+1})$ wherein the coordinates $(x_{i,j}, y_{i,j}, z_i)$ for the $kh_1$ value $(kh_1=2\pi(t_1/\lambda)$ of 1.4 are listed in Table 33, the coordinates $(x_{i,j}, y_{i,j}, z_i)$ for the $kh_1$ value 1.8 are listed in Table 34, the coordinates $(x_{i,j}, y_{i,j}, z_i)$ for the $kh_1$ value 2.4 are listed in Table 35, and the coordinates $(x_{i,j}, y_{i,j}, z_i)$ for the $kh_1$ value 3.0 are listed in Table 36, and wherein the coordinates $(x_{i,j}, y_{i,j}, z_i)$ for the $kh_1$ value $\alpha$ that is larger than 1.4 and smaller than 3.0 and is not 1.8 or 2.4, are expressed by the following equations:

$$x_{l,j}(\alpha) = \frac{(x_{n,j} - x_{m,j})\alpha + (bx_{m,j} - ax_{n,j})}{b - a} \quad (1)$$

$$y_{l,j}(\alpha) = \frac{(y_{n,j} - y_{m,j})\alpha + (by_{m,j} - ay_{n,j})}{b - a}$$

$$z_l(\alpha) = \frac{(z_n - z_m)\alpha + (bz_m - az_n)}{b - a}$$

where the value $kh_1=a$ has the coordinates of the vertexes of $(x_{m,j}, y_{m,j}, z_m)$ and the other value $kh_1=b$ has the coordinates of the vertexes of $(x_{n,j}, y_{n,j}, z_n)$, and the values of m, n, and l for the individual ranges of $kh_1$ are listed in Table 37,

TABLE 33

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 160 | 145, 50 | 150, 45 | 155, 40 | 150, 40 | 145, 40 | 140, 40 | 140, 45 | 140, 50 | 30 |
| 161 |  | 150, 50 | 155, 45 | 150, 45 |  |  | 135, 40 | 135, 50 | 40 |
| 162 | 140, 60 | 150, 60 | 150, 55 | 150, 50 | 140, 50 | 130, 50 | 125, 55 | 130, 60 | 50 |
| 163 | 140, 70 | 145, 70 | 145, 60 | 145, 55 | 140, 55 | 130, 55 | 125, 60 | 130, 65 | 60 |

TABLE 34

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 164 | 90, 60 | 120, 60 | 130, 45 | 120, 30 | 90, 35 | 65, 30 | 50, 45 | 70, 60 | 0 |
| 165 | 100, 60 | 125, 60 | 140, 40 | 130, 30 | 105, 35 | 85, 35 | 60, 35 |  | 10 |
| 166 | 110, 65 | 130, 60 | 150, 40 |  | 110, 35 | 80, 35 | 70, 55 | 90, 60 | 20 |
| 167 | 120, 65 | 140, 60 | 150, 50 | 140, 35 | 120, 35 | 90, 40 | 85, 50 | 100, 65 | 30 |
| 168 | 120, 70 | 140, 65 |  | 140, 40 | 120, 40 | 110, 40 | 90, 45 | 90, 65 | 40 |
| 169 | 125, 75 | 145, 70 | 150, 60 | 140, 50 | 125, 45 | 105, 45 | 95, 60 | 105, 80 | 50 |
| 170 | 130, 75 | 140, 70 | 150, 65 | 140, 60 | 130, 55 | 120, 55 | 110, 60 | 115, 65 | 60 |

TABLE 35

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 171 | 90, 70 | 115, 65 | 130, 50 | 125, 30 | 90, 30 | 55, 30 | 50, 50 | 65, 65 | 0 |
| 172 | 100, 70 | 125, 65 | 135, 50 | 130, 30 | 100, 30 | 65, 30 | 60, 50 | 80, 70 | 10 |
| 173 | 100, 75 | 120, 70 | 140, 55 | 130, 50 | 115, 50 | 85, 50 | 65, 45 | 75, 65 | 20 |
| 174 | 110, 70 | 130, 65 | 140, 50 | 140, 35 | 115, 35 | 90, 35 | 80, 55 | 90, 70 | 30 |
| 175 | 110, 95 | 130, 90 | 145, 60 | 140, 50 | 120, 40 | 115, 40 | 90, 45 |  | 40 |
| 176 | 125, 75 | 130, 70 | 140, 60 | 130, 50 | 120, 50 | 115, 50 | 100, 60 | 105, 75 | 50 |
| 177 | 125, 70 |  | 135, 65 | 130, 65 | 125, 65 | 125, 65 | 115, 65 | 115, 70 | 60 |

TABLE 36

| i | $x_{i,1}, y_{i,1}$ | $x_{i,2}, y_{i,2}$ | $x_{i,3}, y_{i,3}$ | $x_{i,4}, y_{i,4}$ | $x_{i,5}, y_{i,5}$ | $x_{i,6}, y_{i,6}$ | $x_{i,7}, y_{i,7}$ | $x_{i,8}, y_{i,8}$ | $z_i$ |
|---|---|---|---|---|---|---|---|---|---|
| 178 | 90, 70 | 110, 70 | 120, 60 | 120, 35 | 90, 30 | 65, 35 | 60, 55 | 70, 75 | 0 |
| 179 | 95, 70 | 110, 65 | 130, 50 | 110, 35 | 95, 35 | 70, 35 | 65, 50 | 75, 65 | 10 |
| 180 | 100, 70 | 120, 65 | 125, 55 | 125, 45 | 110, 35 | 90, 35 | 70, 50 | 80, 60 | 20 |
| 181 | 110, 70 |  | 130, 50 | 120, 40 | 110, 40 | 95, 40 | 85, 50 | 90, 70 | 30 |
| 182 |  | 115, 65 | 125, 55 | 115, 50 | 110, 50 | 100, 50 | 95, 55 | 100, 75 | 40 |

TABLE 37

| $kh_1$ | m | n | l |
|---|---|---|---|
| $1.4 < kh_1 < 1.8$ | 160 | 167 | 297 |
|  | 161 | 168 | 298 |
|  | 162 | 169 | 299 |
|  | 163 | 170 | 300 |
| $1.8 < kh_1 < 2.4$ | 164 | 171 | 301 |
|  | 165 | 172 | 302 |
|  | 166 | 173 | 303 |
|  | 167 | 174 | 304 |
|  | 168 | 175 | 305 |
|  | 169 | 176 | 306 |
|  | 170 | 177 | 307 |
| $2.4 < kh_1 < 3.0$ | 171 | 178 | 308 |
|  | 172 | 179 | 309 |
|  | 173 | 180 | 310 |
|  | 174 | 181 | 311 |
|  | 175 | 182 | 312 |

\* \* \* \* \*